US012666636B2

(12) United States Patent (10) Patent No.: US 12,666,636 B2

Su et al. (45) Date of Patent: Jun. 23, 2026

(54) SEMICONDUCTOR CONTACT STRUCTURES AND METHODS

(71) Applicant: Taiwan Semiconductor Manufacturing Co., Ltd., Hsinchu (TW)

(72) Inventors: Huan-Chieh Su, Tianzhong Township (TW); Cheng-Chi Chuang, New Taipei City (TW); Chih-Hao Wang, Baoshan Township (TW); Chun-Yuan Chen, Hsinchu (TW); Sheng-Tsung Wang, Hsinchu (TW); Meng-Huan Jao, Taichung City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 378 days.

(21) Appl. No.: 18/354,364

(22) Filed: Jul. 18, 2023

(65) Prior Publication Data

US 2024/0339524 A1 Oct. 10, 2024

Related U.S. Application Data

(60) Provisional application No. 63/494,492, filed on Apr. 6, 2023.

(51) Int. Cl.
H10D 30/01 (2025.01)
H10D 30/62 (2025.01)
(Continued)

(52) U.S. Cl.
CPC ....... H10D 30/024 (2025.01); H10D 30/6211 (2025.01); H10D 30/6219 (2025.01);
(Continued)

(58) Field of Classification Search
CPC ............. H10D 30/6211; H10D 84/853; H10D 30/797; H10D 30/62; H10D 64/021;
(Continued)

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

KR 20210093716 A 7/2021
KR 20220122553 A 9/2022
(Continued)

*Primary Examiner* — Fernando L Toledo
*Assistant Examiner* — Adam S Bowen
(74) *Attorney, Agent, or Firm* — Slater Matsil, LLP

(57) ABSTRACT

A method includes forming a fin protruding from a substrate; forming a gate structure extending over the fin; forming a source/drain region in the fin adjacent the gate structure; forming a first isolation region over the source/drain region; forming a first mask layer over the gate structure; etching the first isolation region using the first mask layer as an etch mask to form a first recess; conformally depositing a second mask layer over the first mask layer and within the first recess; depositing a third mask layer over the second mask layer; etching the third mask layer, the second mask layer, and the first isolation region to form a second recess that exposes the source/drain region; and depositing a conductive material in the second recess.

20 Claims, 43 Drawing Sheets

(51) Int. Cl.
    *H10D 64/01*       (2025.01)
    *H10D 84/01*       (2025.01)
    *H10D 84/03*       (2025.01)
    *H10D 84/85*       (2025.01)

(52) U.S. Cl.
    CPC ......... *H10D 64/017* (2025.01); *H10D 84/017* (2025.01); *H10D 84/0188* (2025.01); *H10D 84/0193* (2025.01); *H10D 84/038* (2025.01); *H10D 84/853* (2025.01)

(58) Field of Classification Search
    CPC ........... H10D 84/0149; H10D 84/0158; H10D 84/0186; H01L 21/76802; H01L 21/76877
    See application file for complete search history.

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2011/0068411 | A1* | 3/2011 | Sun .................... H01L 21/76804 |
| | | | 257/384 |
| 2011/0147842 | A1 | 6/2011 | Cappellani et al. |
| 2015/0287779 | A1 | 10/2015 | Jhaveri et al. |
| 2018/0323055 | A1 | 11/2018 | Woodruff et al. |
| 2019/0214315 | A1 | 7/2019 | Leobandung |
| 2019/0378722 | A1 | 12/2019 | Economikos et al. |
| 2021/0134969 | A1 | 5/2021 | Huang et al. |
| 2021/0225706 | A1 | 7/2021 | Huang |
| 2021/0366786 | A1* | 11/2021 | Chen .................. H10D 30/6219 |
| 2021/0375695 | A1* | 12/2021 | Chen .................. H01L 21/31111 |
| 2021/0376095 | A1* | 12/2021 | Chen .................. H01L 21/28525 |
| 2022/0246473 | A1 | 8/2022 | Lu et al. |
| 2022/0277994 | A1 | 9/2022 | Lai et al. |

FOREIGN PATENT DOCUMENTS

| | | | |
|---|---|---|---|
| TW | 201137985 | A | 11/2011 |
| TW | 202117818 | A | 5/2021 |
| TW | 202232603 | A | 8/2022 |

* cited by examiner

SEMICONDUCTOR CONTACT STRUCTURES AND METHODS

PRIORITY CLAIM AND CROSS-REFERENCE

This application claims the benefit of U.S. Provisional Application No. 63/494,492, filed on Apr. 6, 2023, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
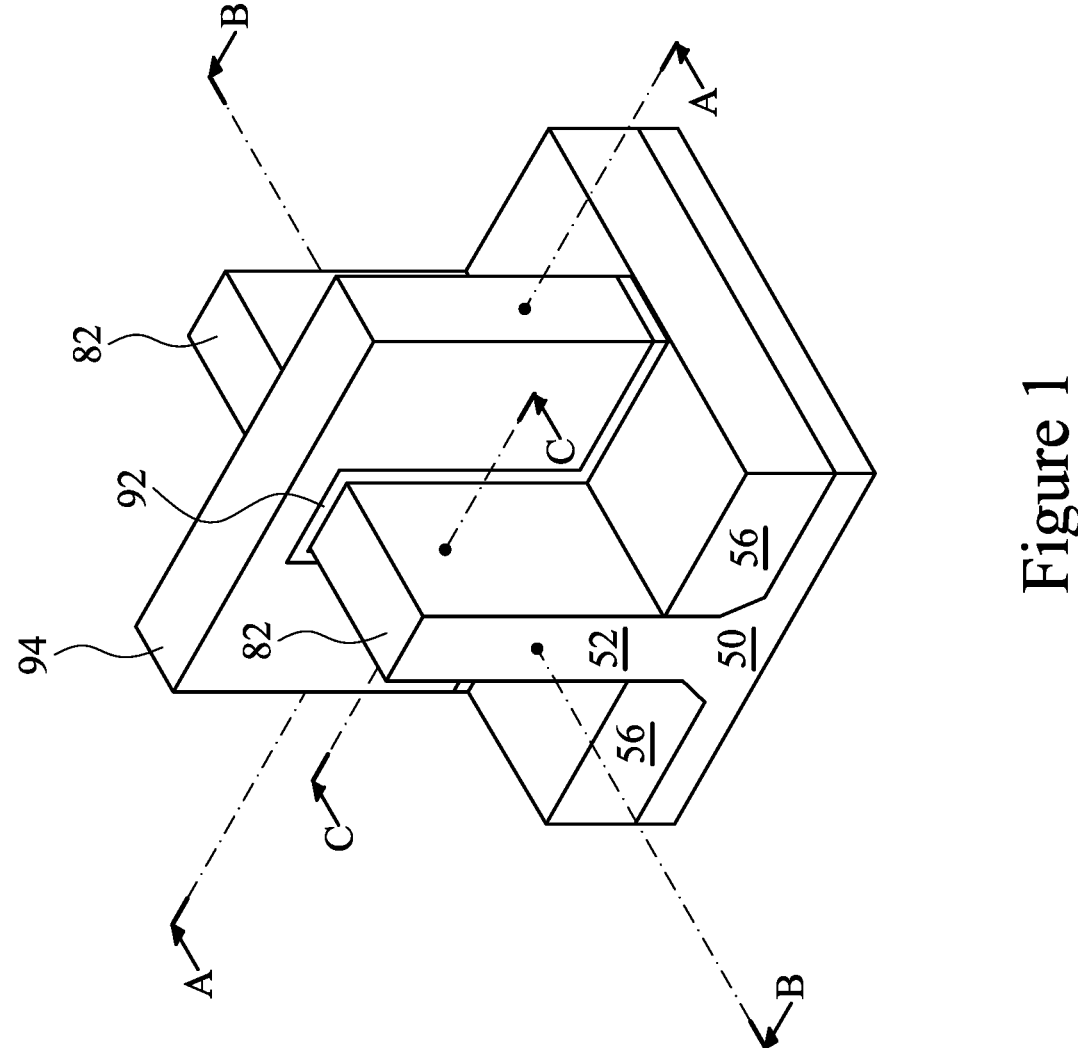
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments described herein allow for the formation of self-aligned contacts, contact plugs, conductive features, and the like having smaller widths, smaller separation, and reduced manufacturing costs. For example, embodiments described herein include the formation of source/drain contacts and gate stacks having level top surfaces, which can allow for smaller separation between the source/drain contacts and the gate stacks. Embodiments described herein allow for the formation of source/drain contacts, gate contacts, and overlying conductive features with a reduced risk of electrical shorting. In this manner, embodiments described herein can allow for increased device density, improved process flexibility, improved yield, or reduced costs.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. Source/drain region(s) 82 may refer to a source or a drain, individually or collectively dependent upon the context. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 26 are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, and 14A are illustrated along reference cross-section A-A illustrated in FIG. 1, and FIGS. 8B, 9B, 10B, 11B, 12B, 13B, 14B, 14C, 15, 16, 17, 18, 19A, 20, 21, 22, 23, 24, 25, and 26 are illustrated along reference cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
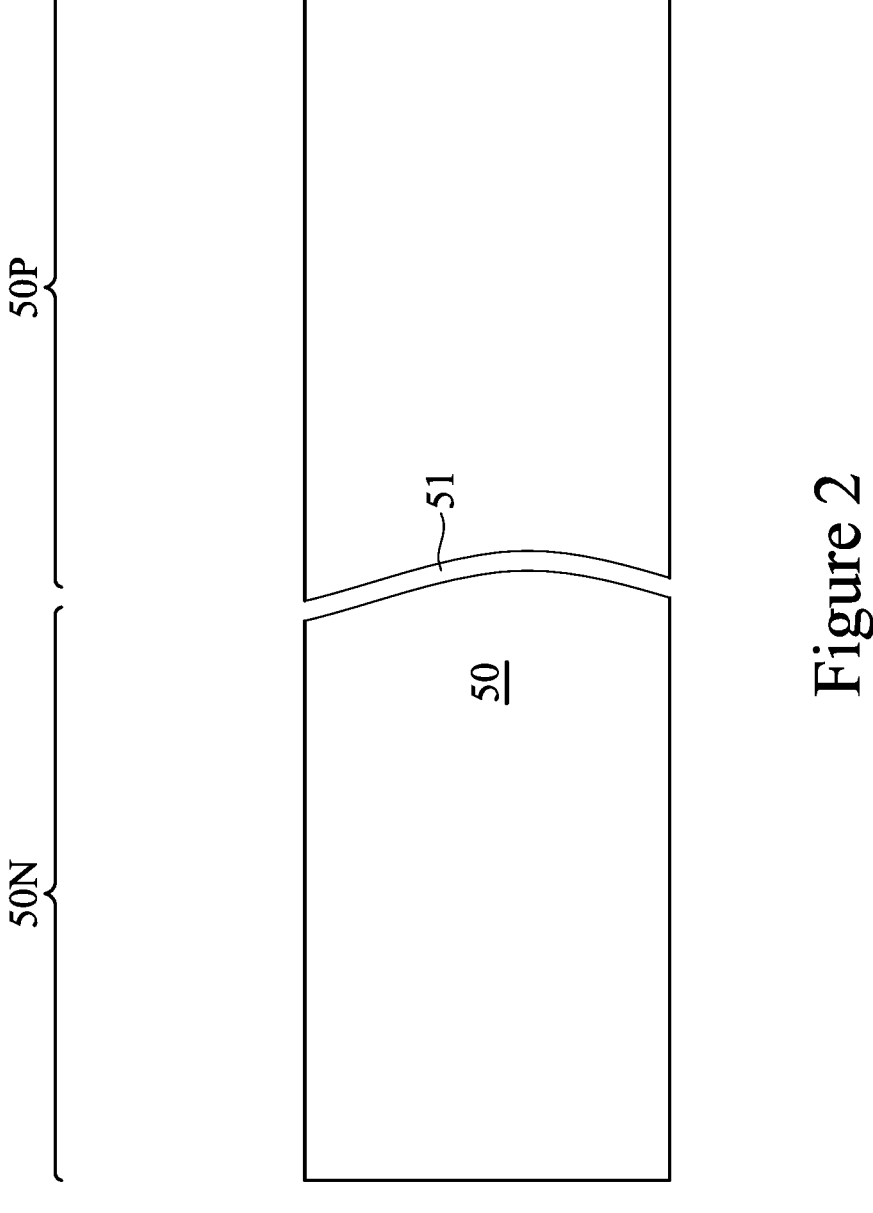
FIGS. 2, 3, 4, 5, 6, 7, 8A, 8B, 9A, 9B, 10A, 10B, 10C, 10D, 11A, 11B, 12A, 12B, 13A, 13B, 14A, 14B, and 14C are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
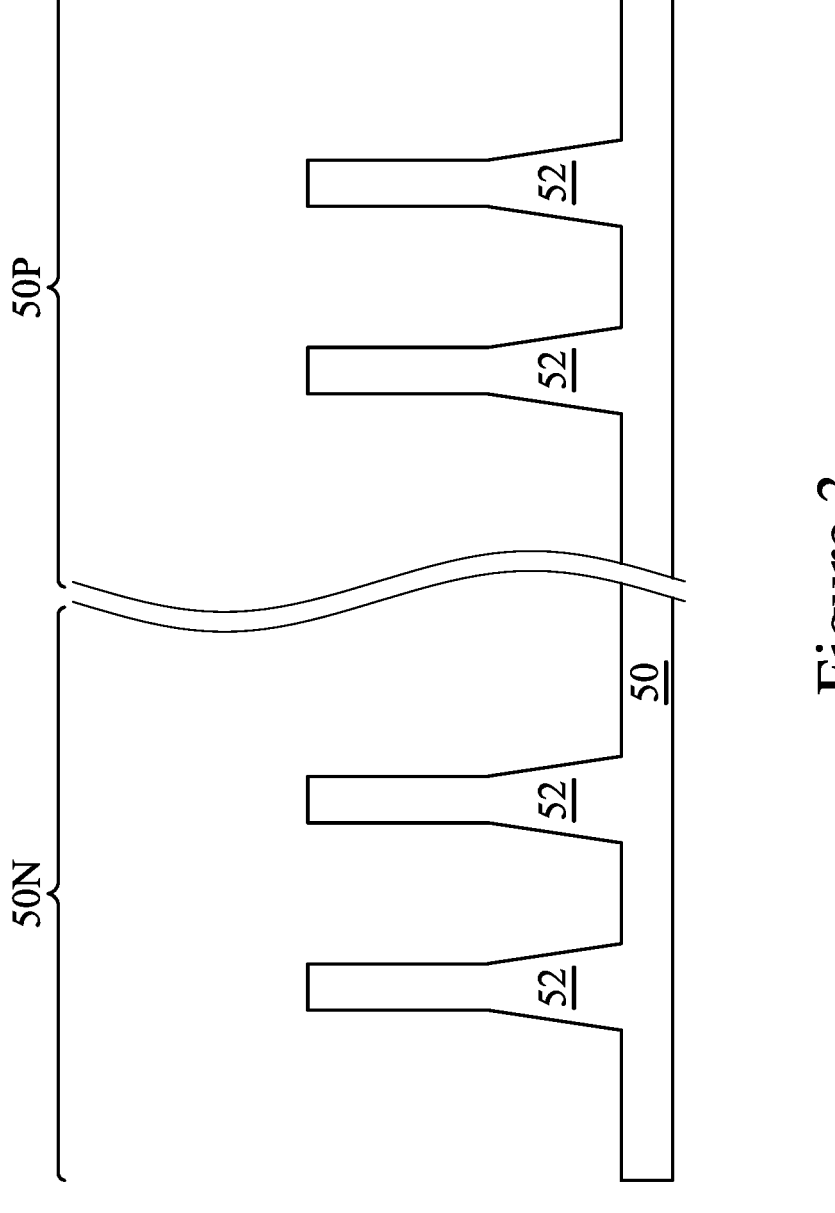

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
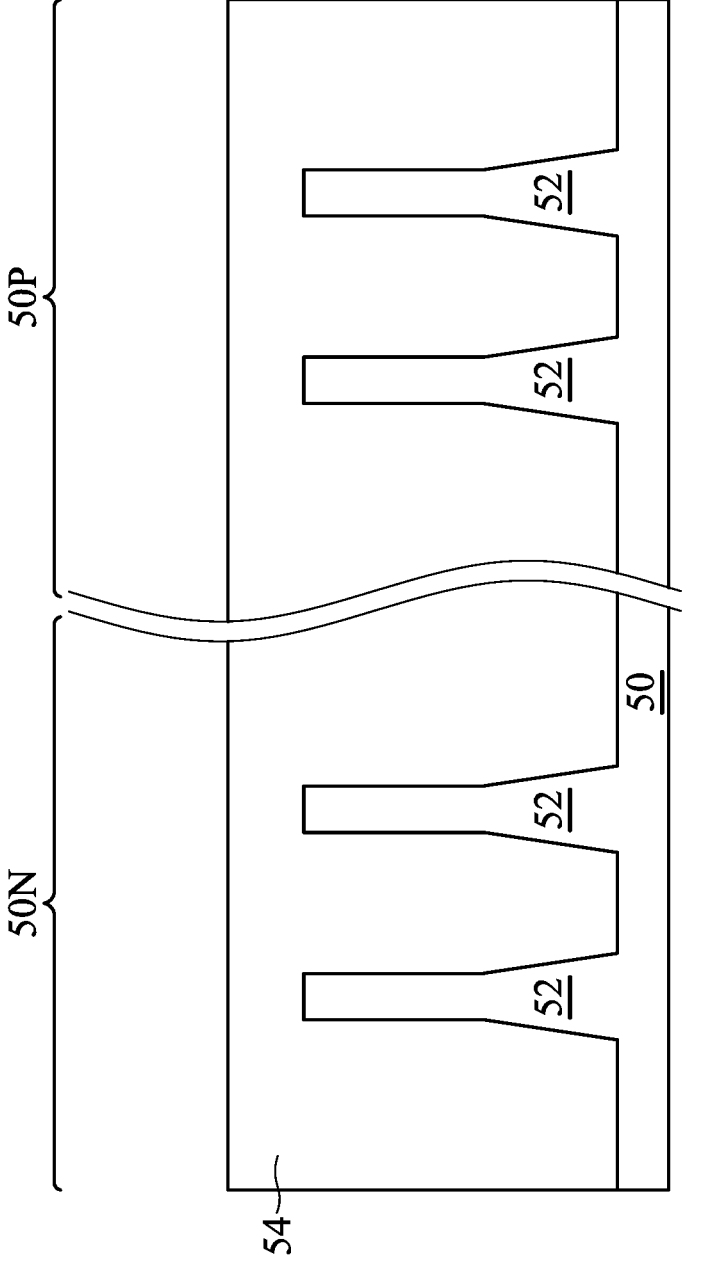

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
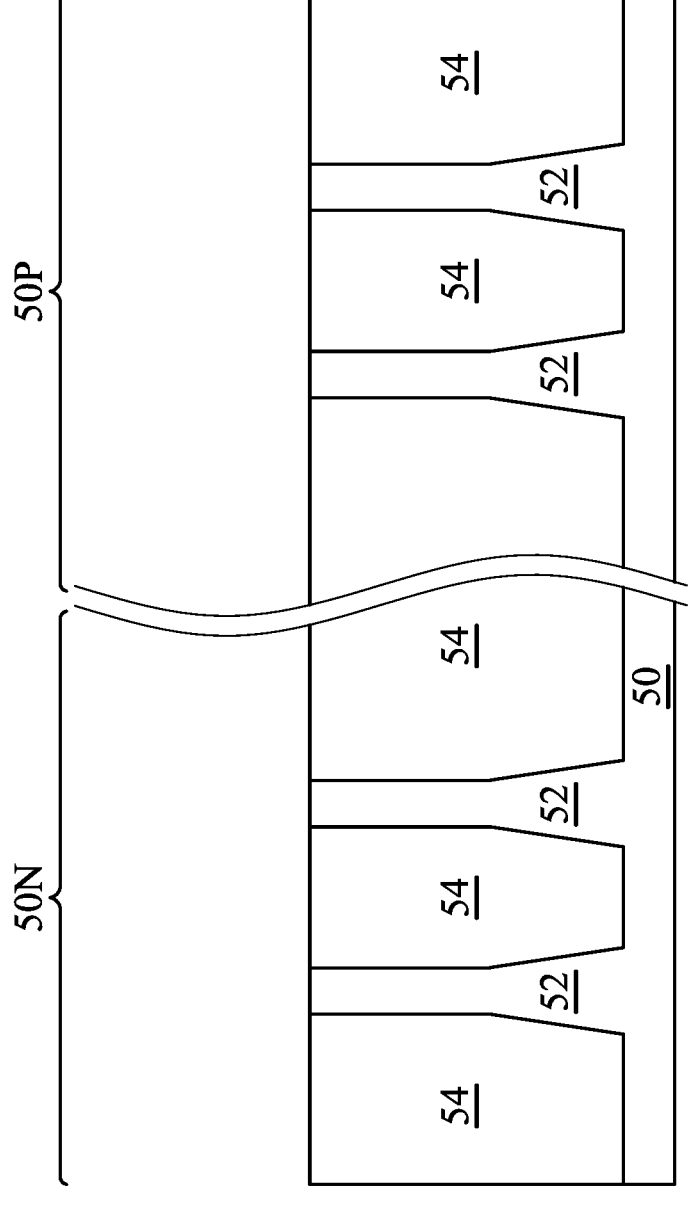

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
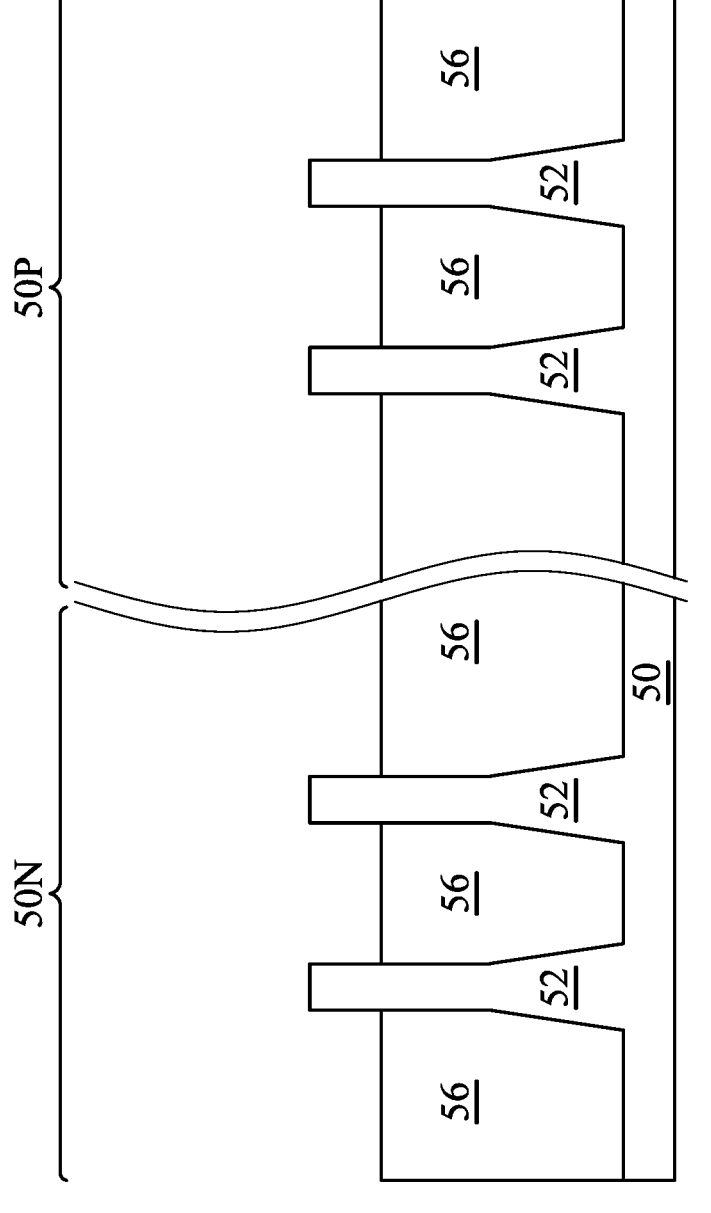

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P.

The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
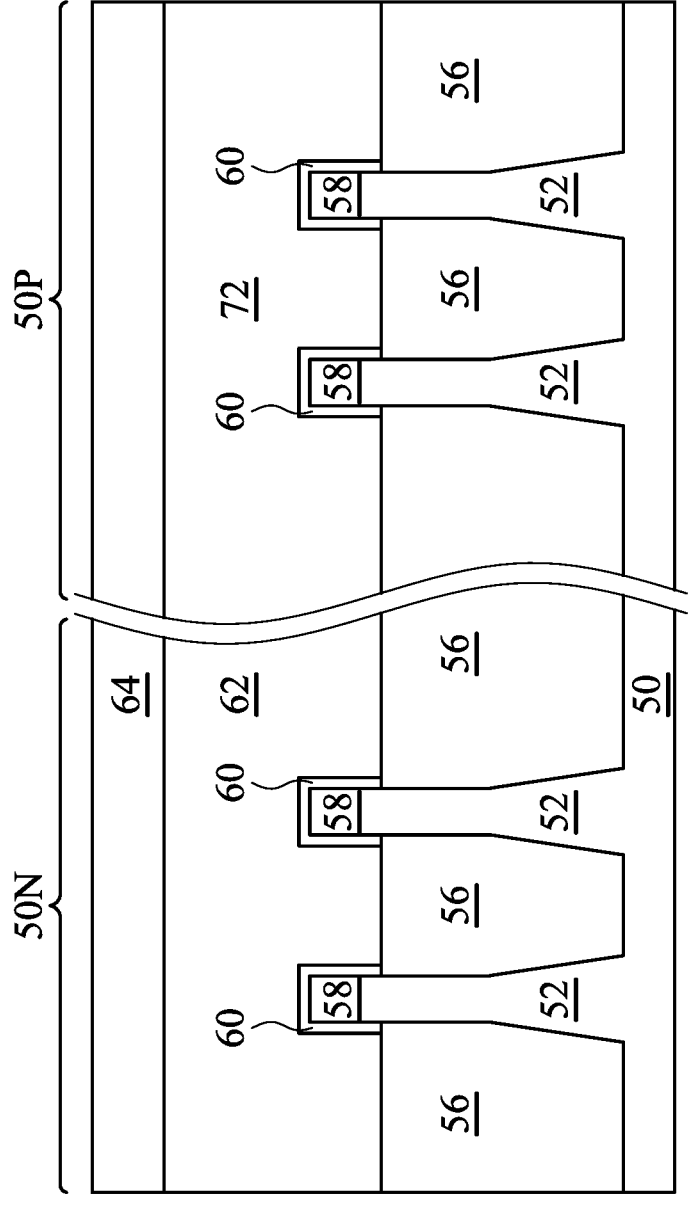

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 14C illustrate various additional steps in the manufacturing of embodiment devices. FIGS. 8A through 14C illustrate features in either of the n-type region 50N and the p-type region 50P. For example, the structures illustrated in FIGS. 8A through 14C may be applicable to both the n-type region 50N and the p-type region 50P. Differences (if any) in the structures of the n-type region 50N and the p-type region 50P are described in the text accompanying each figure.

Figure 8B:
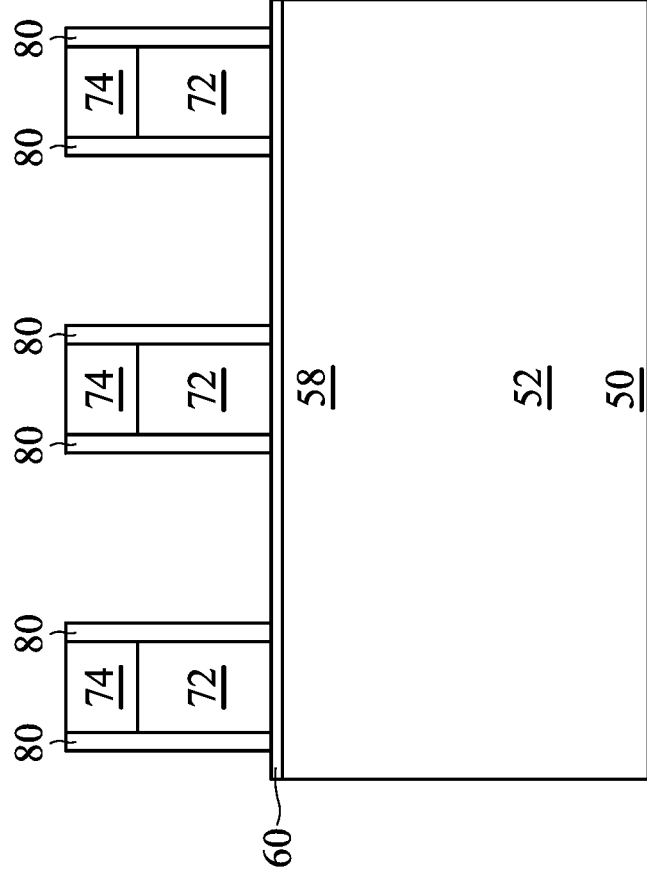
Figure 8A:
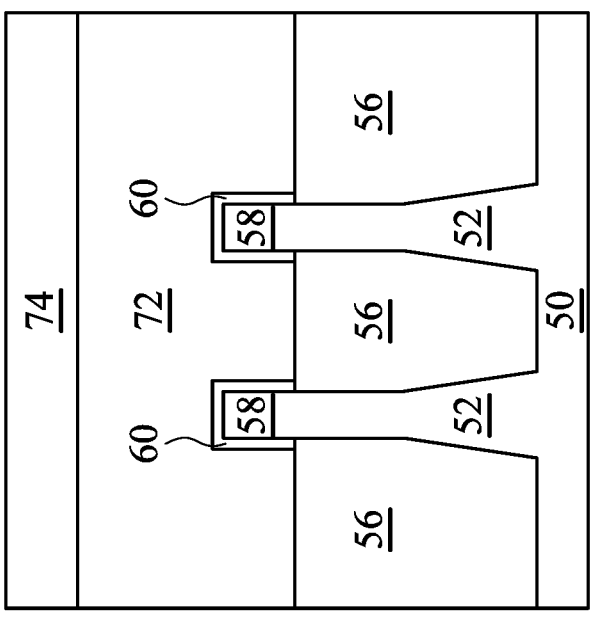

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
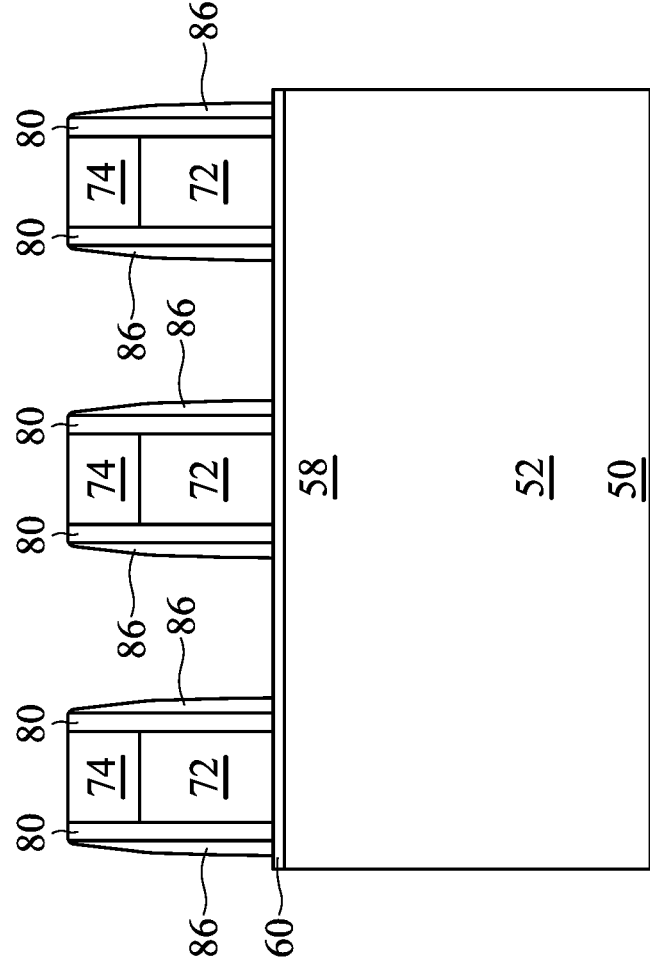
Figure 9A:
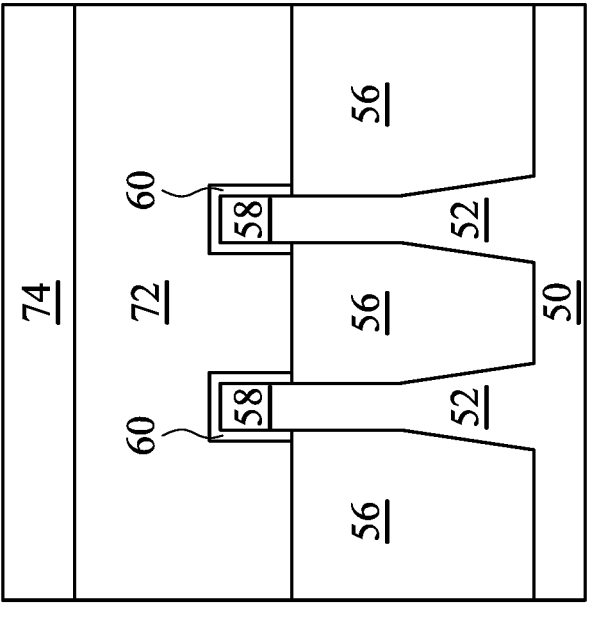

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers) spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
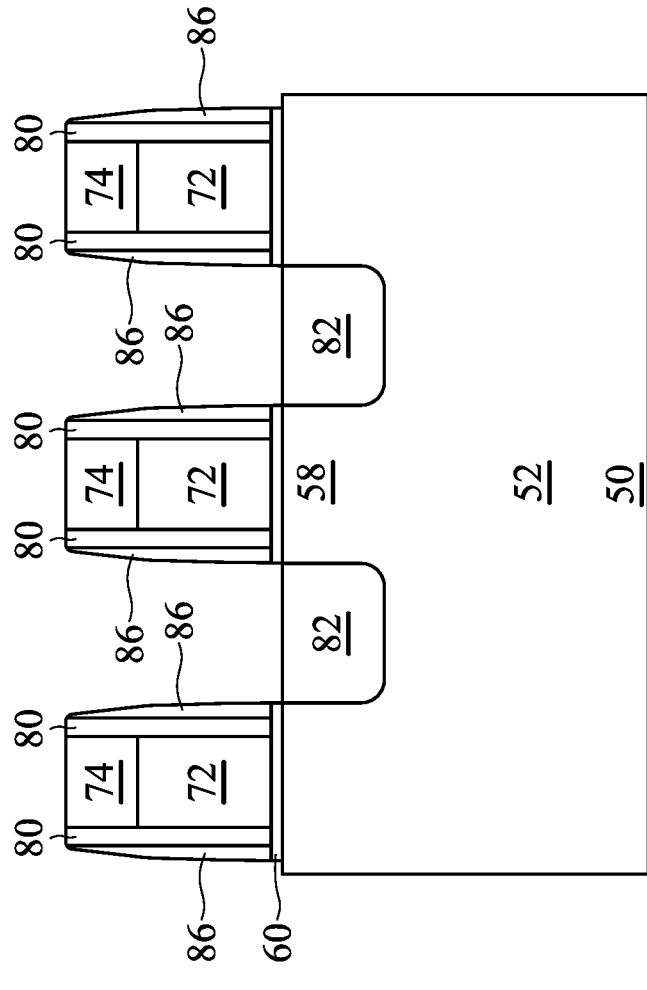
Figure 10A:
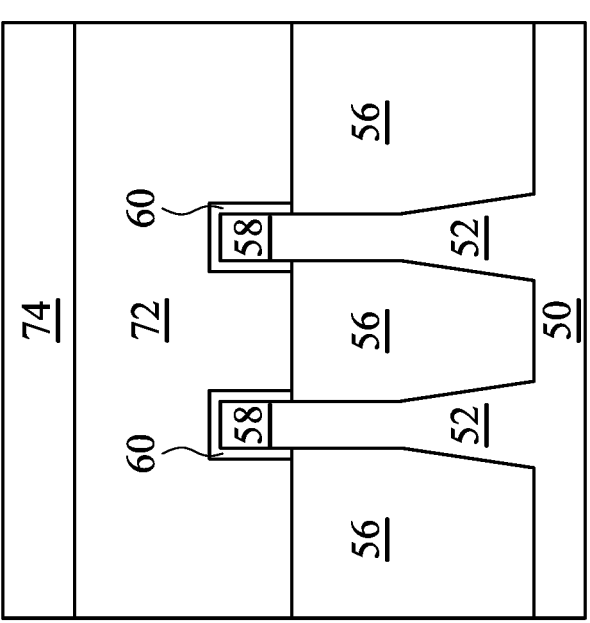
Figure 10D:
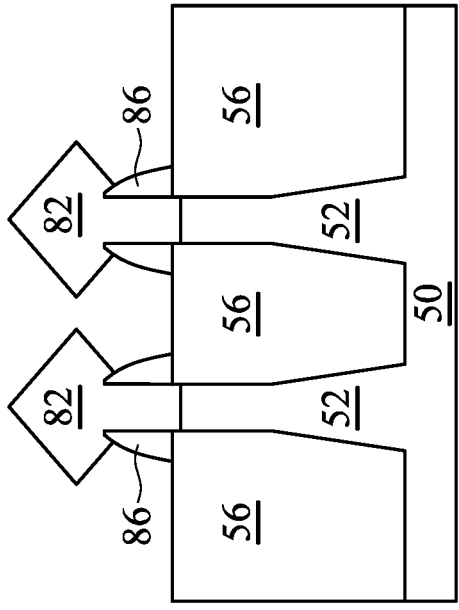
Figure 10C:
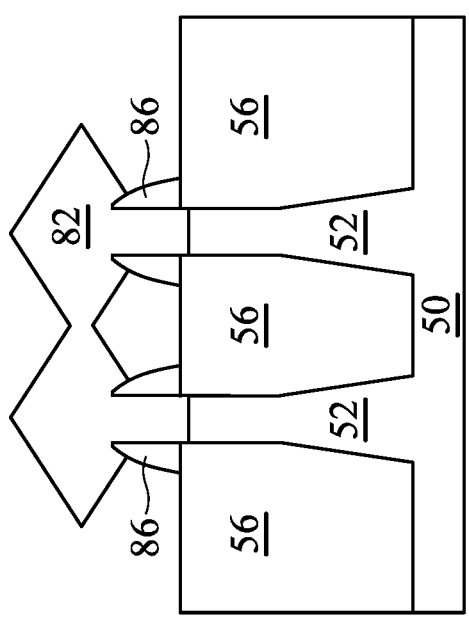

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figures 11A, 11B:
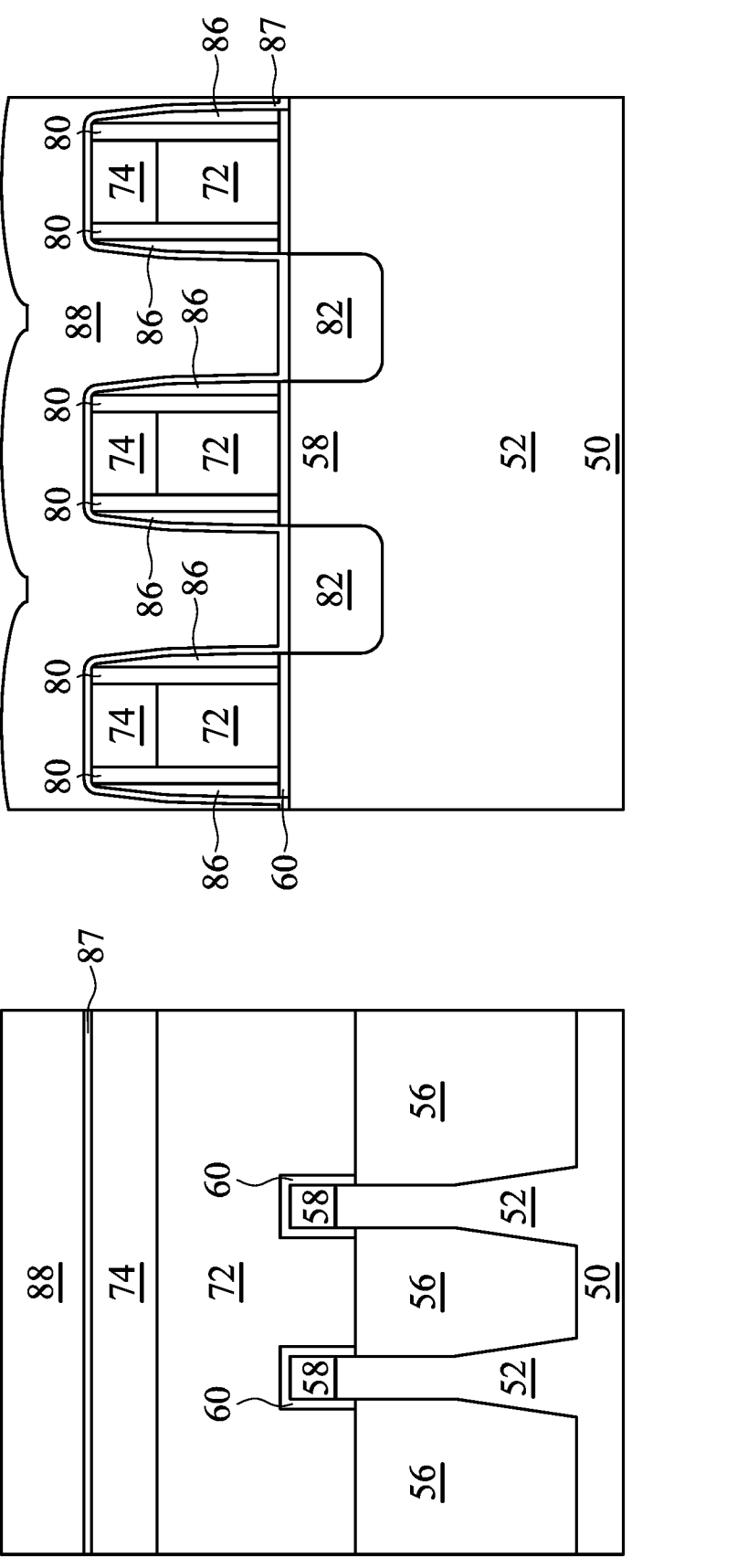

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figures 12A, 12B:
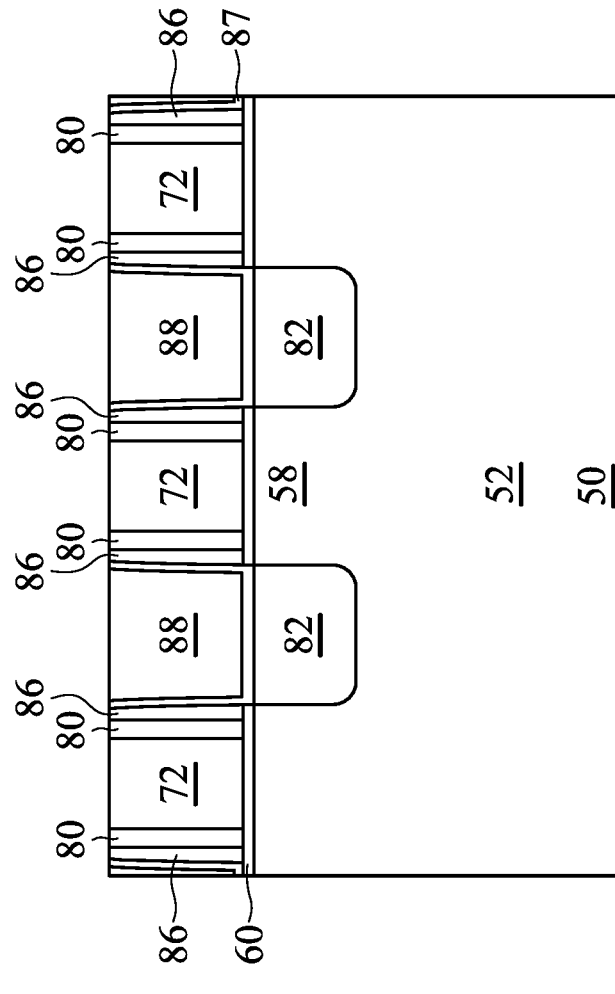

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surface of the masks 74.

Figure 13B:
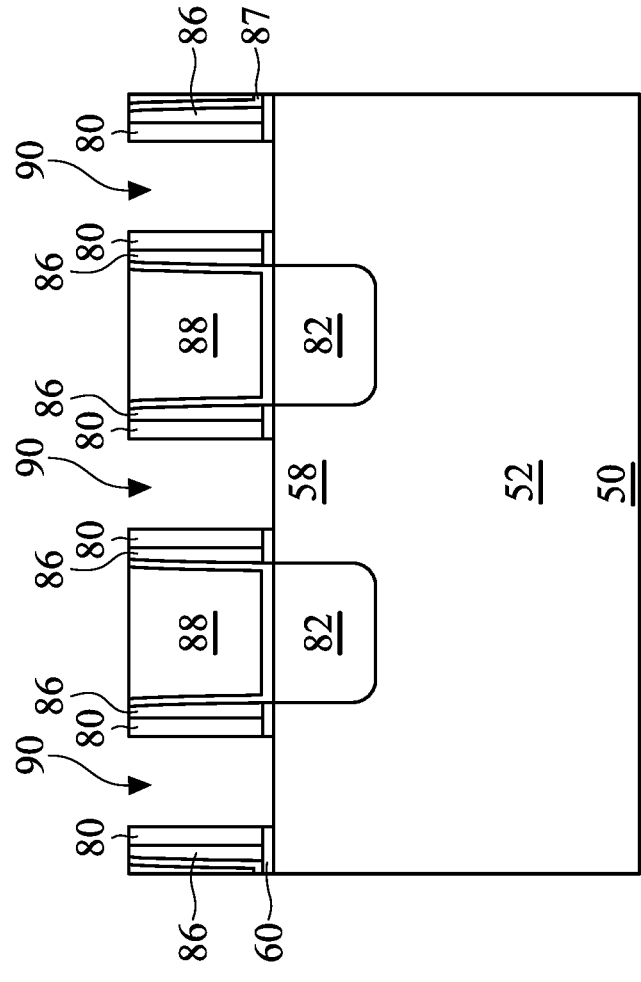
Figure 13A:
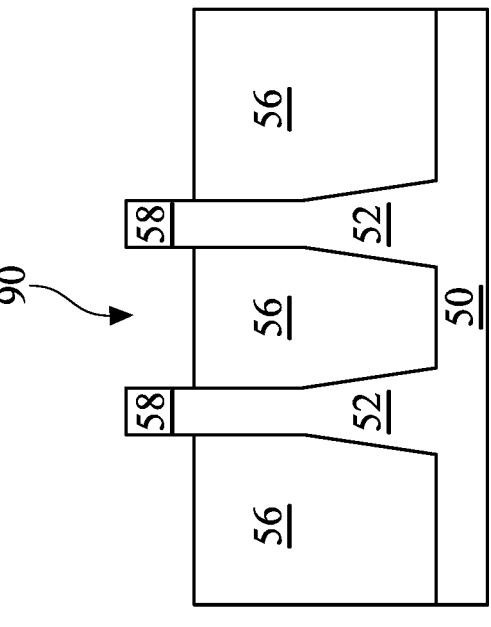

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figures 14A, 14B:
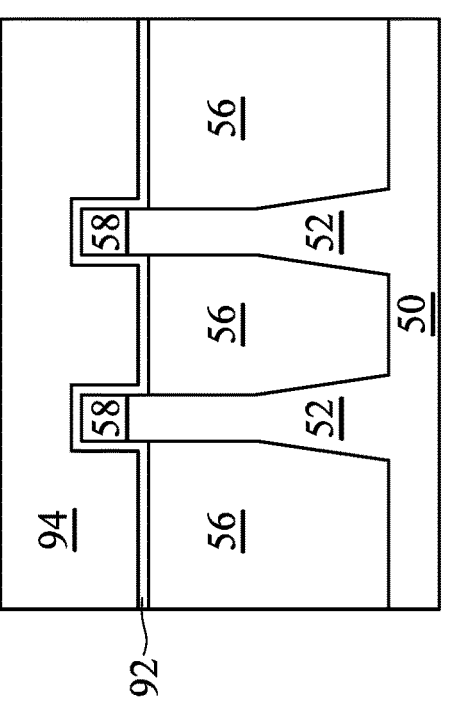
Figure 14C:
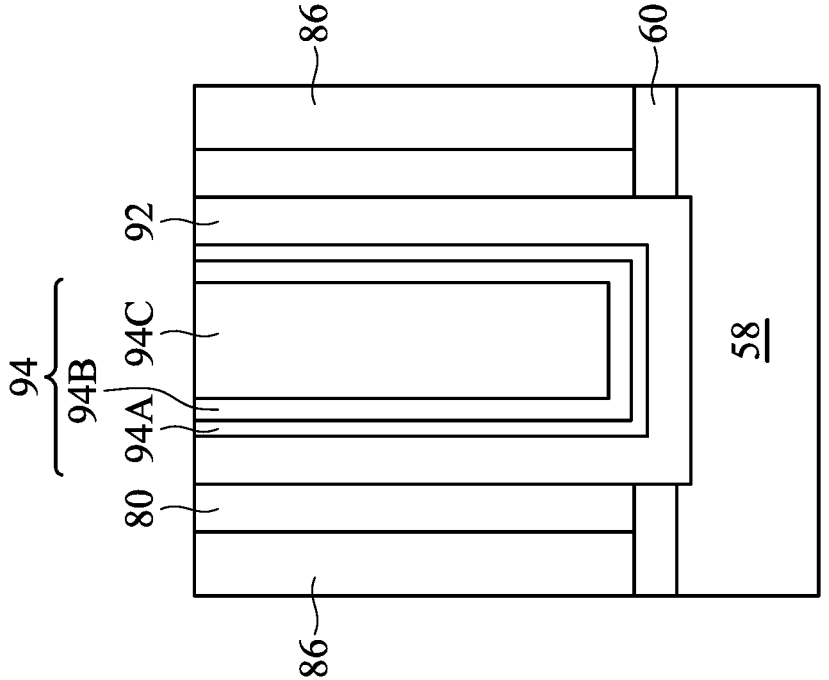

In FIGS. 14A and 14B, gate dielectric layers 92 and gate electrodes 94 are formed for replacement gates. FIG. 14C illustrates a detailed view of region 89 of FIG. 14B. Gate dielectric layers comprise 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., SiO2).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes. In some embodiments, adjacent gate stacks may be separated by a lateral distance that is in the range of about 20 nm to about 50 nm, though other separation distances are possible. In some cases, the techniques described herein allow for the formation of gate stacks having smaller separation distances.

FIGS. 15 through 24 illustrate intermediate steps in the formation of source/drain contacts 110 (see FIG. 24), in accordance with some embodiments. FIGS. 15 through 24 illustrate features in either of the n-type region 50N and the p-type region 50P. For clarity, some features shown in FIGS. 1 through 14C may not be shown in FIGS. 15 through 24. For example, the gate seal spacers 80 are not individually shown in FIGS. 15 through 24. The process steps shown in FIGS. 15-24 may be performed on a structure similar to that shown in FIGS. 14A-14C. Unless otherwise indicated, the process steps shown in FIG. 15-24 are cross-sectional views along cross-section B-B illustrated in FIG. 1, similar to the cross-sectional view of FIG. 14B.

Figure 15:
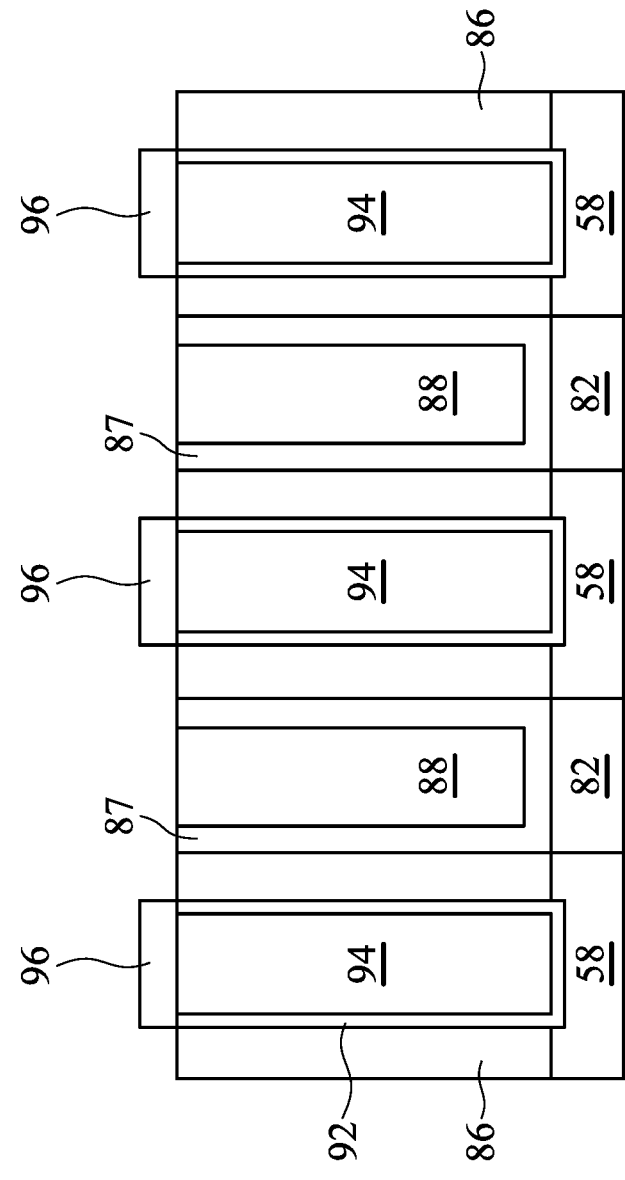
FIGS. 15, 16, 17, 18, 19A, 19B, 19C, 20, 21, 22, 23, 24 are various views of intermediate stages in the manufacturing of FinFETs, in accordance with some embodiments.

In FIG. 15, a gate mask 96 is formed on the structure, in accordance with some embodiments. FIG. 15 illustrates a magnified view of the structure shown in FIG. 14C. For example, FIG. 15 is illustrated along the cross-section B-B, similar to the view shown in FIG. 14C. In some embodiments, the gate mask 96 may be selectively deposited such that top surfaces of the gate electrodes 94 and/or the gate dielectric layers 92 are covered by the gate mask 96, but top surfaces of the first ILD 88, the gate spacers 86, the gate seal spacers 80, and the CESL 87 remain exposed. The material of the gate mask 96 may be selectively deposited on the gate electrodes 94 and/or the gate dielectric layers 92 using a suitable technique, such as cyclic CVD, cyclic ALD, electroless deposition (ELD), or the like. In some embodiments, the gate mask 96 may include a material such as SiC, SiO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, another metal oxide, the like, or a combination thereof. In some embodiments, the gate mask 96 may include a metal such as tungsten, ruthenium, cobalt, copper, molybdenum, another metal, the like, or a combination thereof. In some embodiments, the gate mask 96 may include a metal nitride such as tantalum nitride, titanium nitride, the like, or a combination thereof. Other selective deposition techniques or materials are possible. In some embodiments, the gate mask 96 is deposited to a thickness in the range of about 2 nm to about 12 nm, though other thicknesses are possible. In some cases, the gate mask 96 may be considered a "self-aligned contact mask" or a "capping layer." In some cases, the techniques described herein allow for the formation of mask layers over the gate stacks without the use of an etch-back process.

Figure 16:
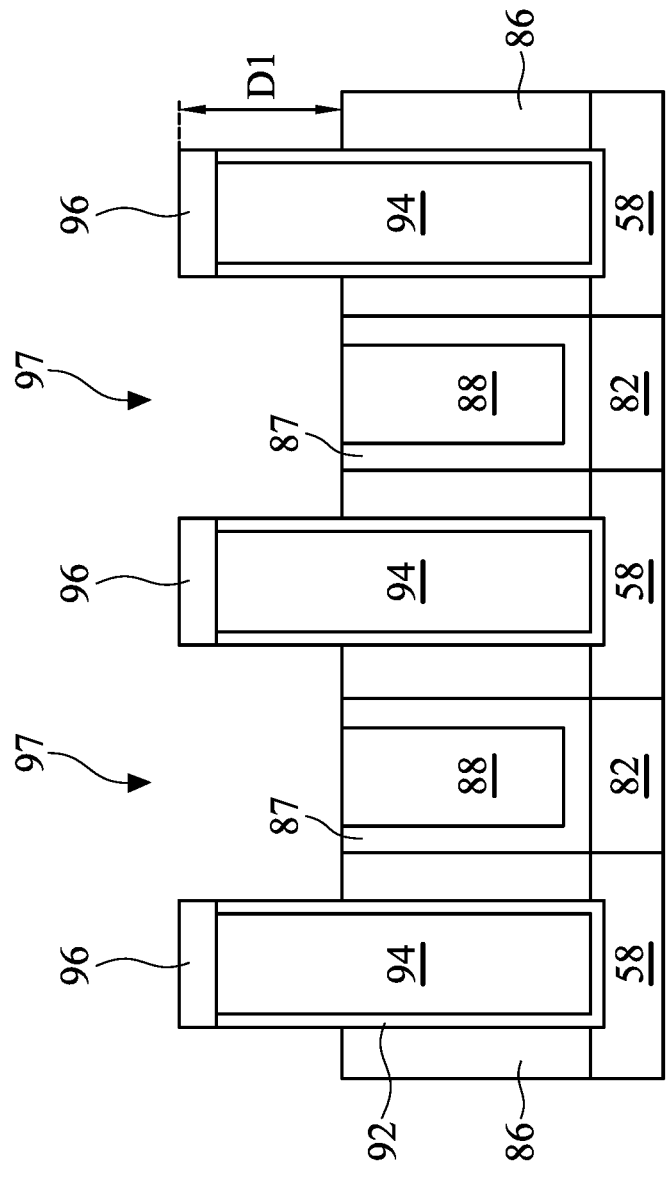

In FIG. 16, an etching process is performed to recess the first ILD 88, the gate spacers 86, the gate seal spacers 80, and the CESL 87, in accordance with some embodiments. The gate mask 96 protects top surfaces of the gate electrodes 94 and/or the gate dielectric layers 92 during the etching process. In this manner, the etching process forms recesses 97 between gate stacks. The etching process may include a wet etching process, a dry etching process, or a combination thereof. The etching process may be anisotropic. In some embodiments, the etching process forms recesses 97 having a depth D1 in the range of about 9 nm to about 54 nm. Other recess depths are possible.

Figure 17:
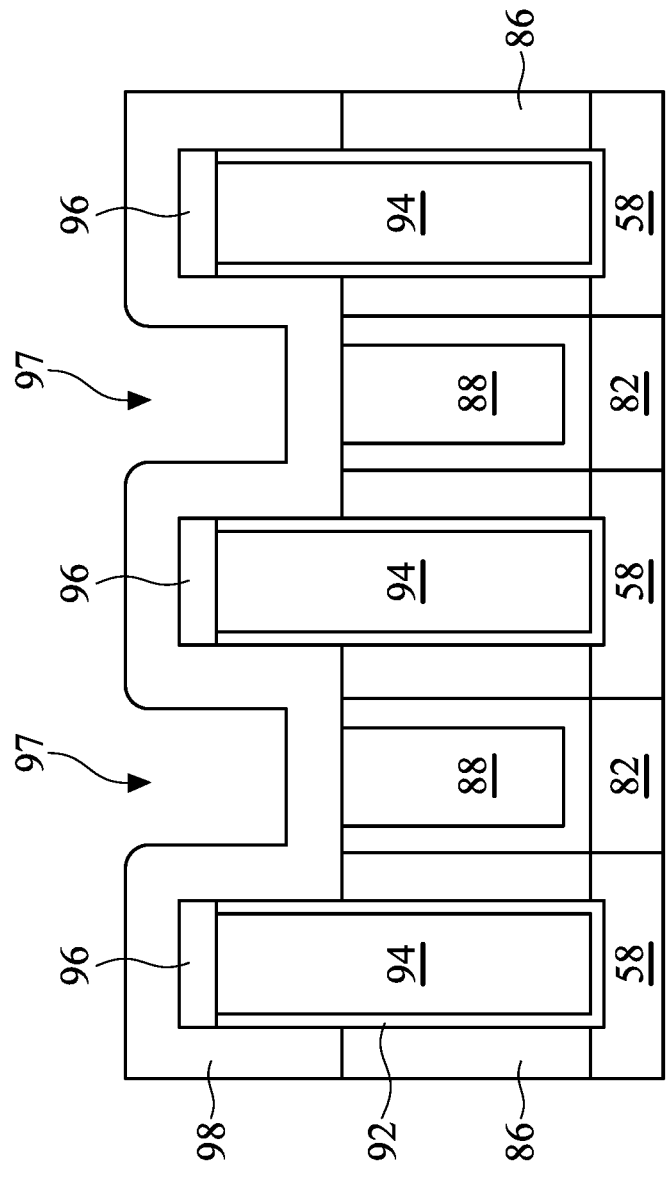

In FIG. 17, a dielectric layer 98 is deposited over the structure, in accordance with some embodiments. The dielectric layer 98 may be conformally deposited on exposed top surfaces and sidewalls using a suitable process, such as ALD, CVD, or the like. In some embodiments, the dielectric layer 98 includes one or more materials such as silicon nitride, silicon oxide, silicon oxynitride, silicon oxycarbide, silicon oxycarbonitride, the like, or a combination thereof. In some embodiments, the dielectric layer 98 is deposited to a thickness in the range of about 4 nm to about 15 nm. Other deposition techniques, materials, or thicknesses are possible. In some embodiments, the dielectric layer 98 may be considered to be a hard mask layer.

Figure 18:
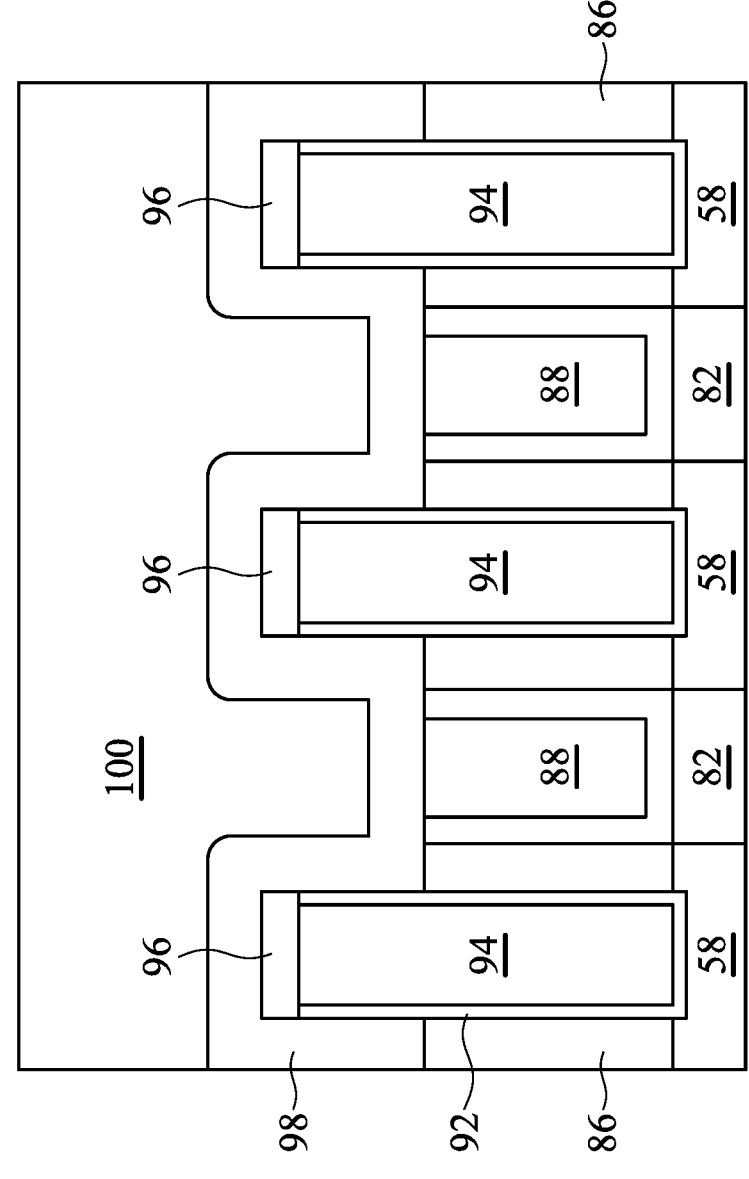

In FIG. 18, a dielectric layer 100 is deposited over the dielectric layer 98, in accordance with some embodiments. The dielectric layer 100 may fill the recesses 97 and may extend over the gate stacks. The dielectric layer 100 may be deposited using a technique such as CVD, ALD, spin-on, or the like. The dielectric layer 100 may comprise one or more materials that may be similar to or different than the material of the dielectric layer 98. For example, in some embodiments, the dielectric layer 100 may include silicon nitride, silicon oxide, silicon oxynitride, silicon oxycarbide, silicon oxycarbonitride, the like, or a combination thereof. In some embodiments, the dielectric layer 100 includes a material such as metal oxide, tungsten carbide, titanium nitride, the like, or a combination thereof. The dielectric layer 100 may comprise multiple layers of different materials, in some embodiments. In some embodiments, the dielectric layer 100 is deposited to a thickness in the range of about 4 nm to about 15 nm. Other deposition techniques, materials, or thicknesses are possible.

Figure 19A:
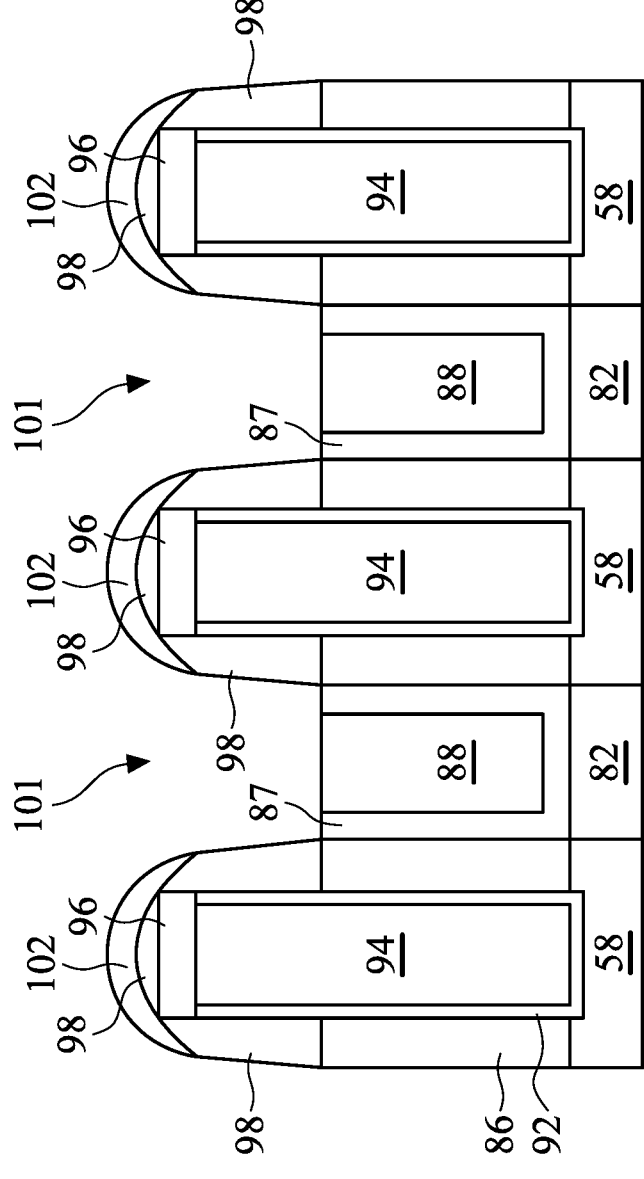
Figure 19B:
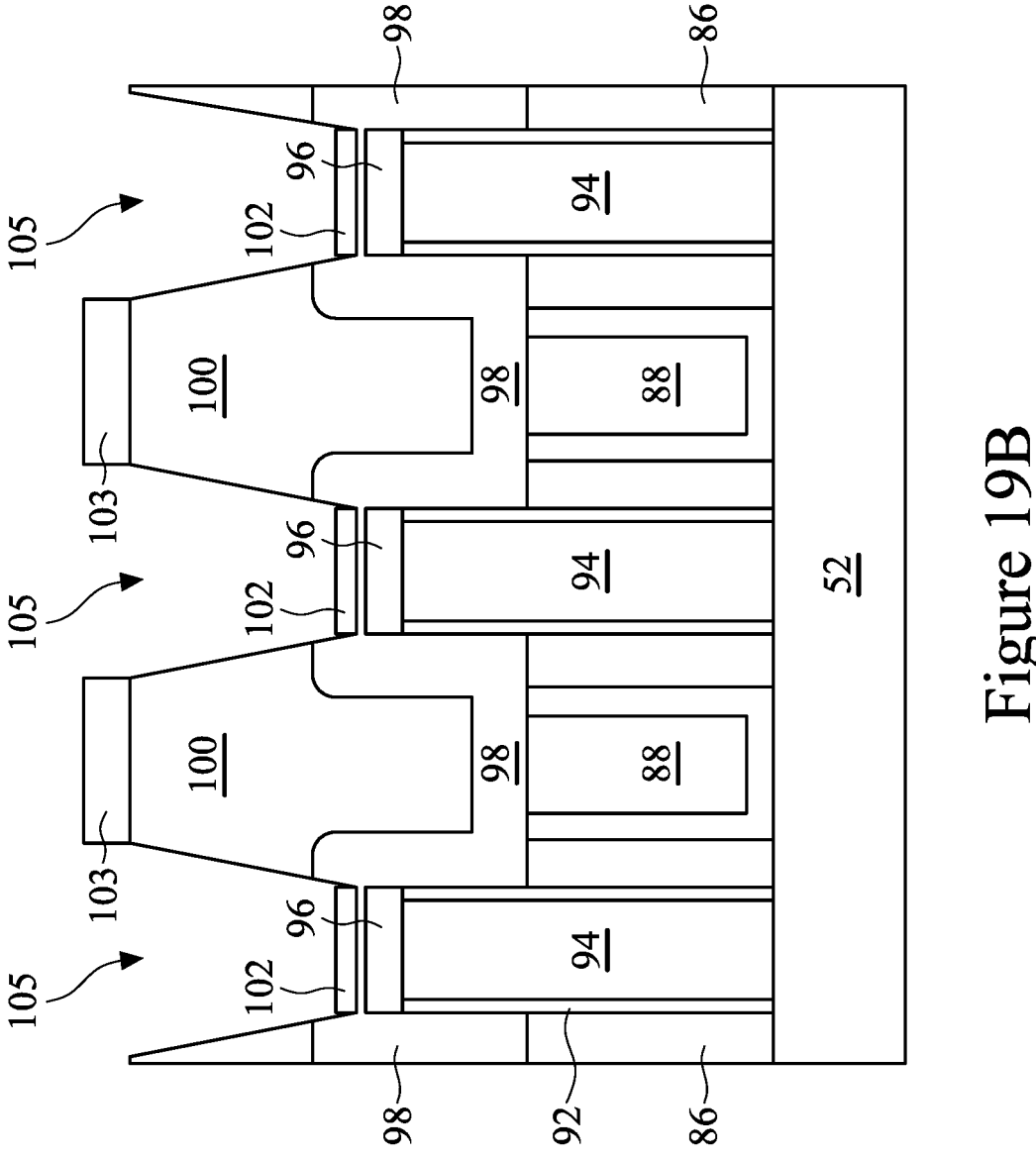
Figure 19C:
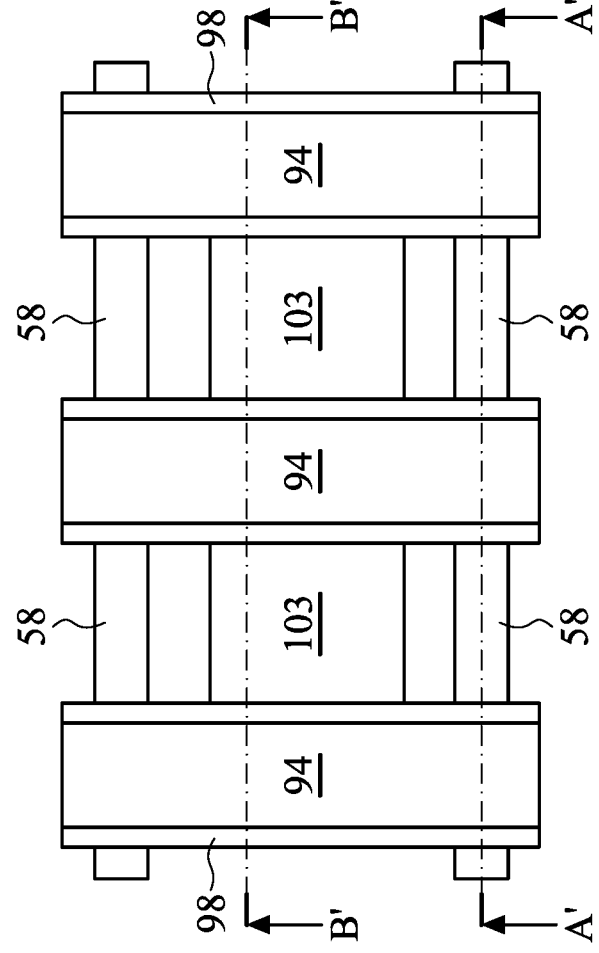

In FIGS. 19A, 19B, and 19C, an etching process is performed to etch recesses 101/105 in the dielectric layers 98/100, in accordance with some embodiments. FIG. 19C illustrates a schematic plan view of the structure, in accordance with some embodiments. Some features not shown in FIG. 19C for clarity. FIG. 19A illustrates a cross-sectional view similar to that indicated by cross-section A'-A' in FIG. 19C, which may be similar to the cross-section B-B shown in FIG. 1. FIG. 19B illustrates a cross-sectional view similar to that indicated by cross-section B'-B' in FIG. 19C.

In some embodiments, a mask layer 103 is first formed over the structure and patterned. The mask layer 103 may comprise a photoresist, hard mask material, or the like, and may be patterned using suitable photolithography and etching techniques. The etching process may be performed using the patterned mask layer 103 as an etch mask to form recesses 101 and 105. The etching process may include one or more etching steps and may include a wet etching process, a dry etching process, or a combination thereof. The etching process may be anisotropic. As shown in FIG. 19A, the etching process removes portions of the dielectric layers 98/100 to form recesses 101 between adjacent gate stacks over the fins 52. The recesses 101 may expose the first ILD 88 and/or the CESL 87, in some embodiments. In some embodiments, the exposed surfaces of the first ILD 88 and the CESL 87 may be approximately level, but in other embodiments, the exposed surfaces of the first ILD 88 and the CESL 87 may have different heights. For example, exposed surfaces of the first ILD 88 may be higher or lower than exposed surfaces of the CESL 87, in some embodiments. As shown in FIG. 19B, the etching process removes portions of the dielectric layers 98/100 to form recesses 105 over the gate stacks between adjacent fins 52. The locations of the recesses 105 are defined by the patterned mask layer 103.

In some embodiments, an optional polymer material 102 is formed over the gate stacks. The polymer material 102 may be formed to protect the gate stacks during the etching process that forms the recesses 101/105 or during subsequent etching processes. In some embodiments, the polymer material 102 may be formed during the etching process that forms the recesses 101/105. In other embodiments, the polymer material 102 may be formed or deposited in a separate process, such as a process performed after the etching process that forms the recesses 101/105. The polymer material 102 may be a material such as tungsten carbide, tungsten nitride, boron nitride, the like, other suitable materials, or a combination thereof.

Figure 20:
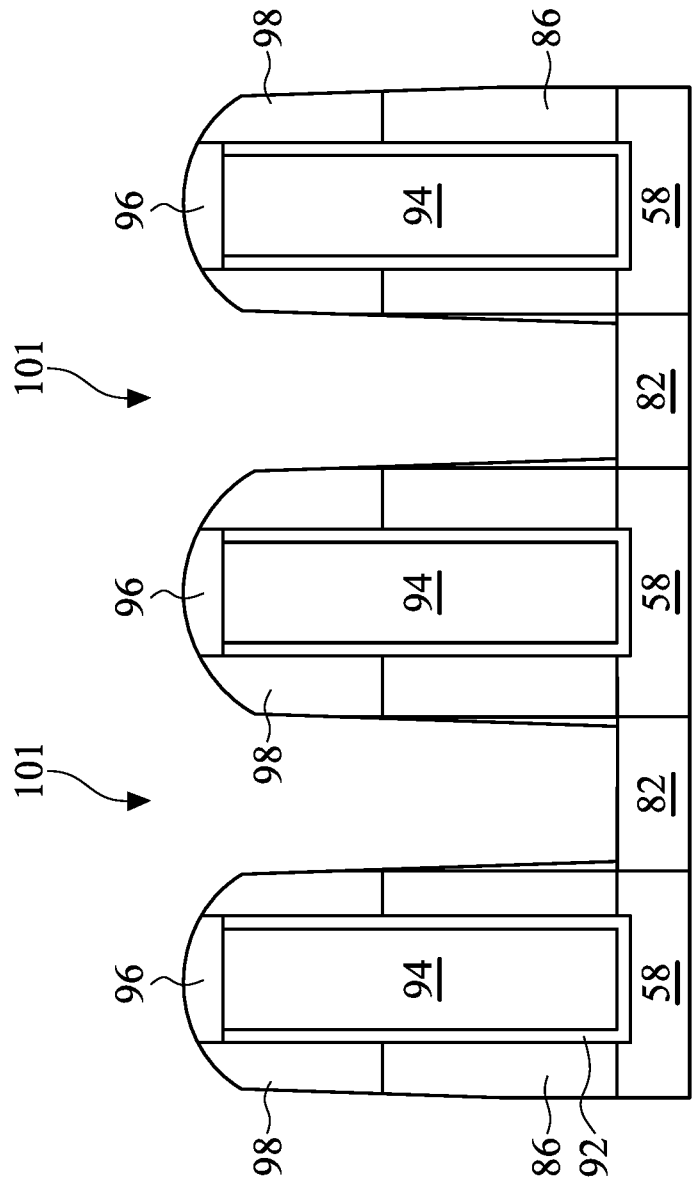

In FIG. 20, an etching process is performed to extend the recesses 101 and expose the source/drain regions 82, in accordance with some embodiments. In some embodiments, the etching process of FIGS. 19A-19C is combined with the etching process of FIG. 20. The etching process may include one or more etching steps and may include a wet etching process, a dry etching process, or a combination thereof. The etching process may be anisotropic. As shown in FIG. 20, the etching process may remove portions of the dielectric layer 98 over the gate mask 96, and may remove portions of the gate mask 96. The etching process may also partially or fully remove portions of the CESL 87 within the recesses 101. The polymer material 102 and/or the patterned mask layer 103 may also be removed during the etching process, in some embodiments. In other embodiments, polymer material 102 and/or the patterned mask layer 103 are removed after the etching process. In some cases, the etching processes that expose the source/drain regions 82 allow for the formation of recesses 101 that are approximately centered between adjacent gate stacks. In other words, the techniques described herein can reduce the lateral shift of the recesses 101 with respect to the gate stacks.

Figure 21:
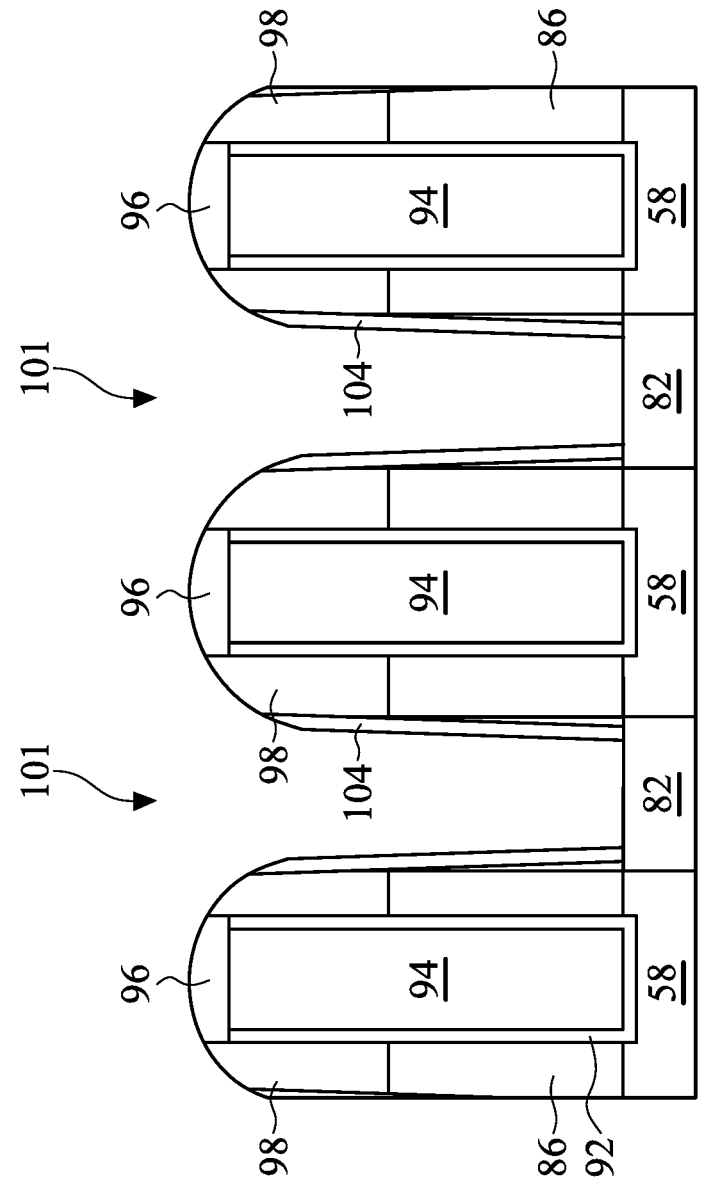

In FIG. 21, a liner 104 is deposited on sidewalls of the recesses 101, in accordance with some embodiments. In some embodiments, the liner 104 may be formed by first depositing the material of the liner 104 and then performing an etching process to remove material of the liner 104 from top surfaces or lateral surfaces. The etching process may include one or more etching steps and may include a wet etching process, a dry etching process, or a combination thereof. The etching process may be anisotropic. The remaining material of the liner 104 on the sidewalls of the recesses 101 (e.g., on the sidewalls of the gate spacers 86, the dielectric layer 98, and/or the CESL 87) forms the liner 104. The material of the liner 104 may include silicon nitride, titanium, titanium nitride, tantalum, tantalum nitride, or the like. The material of the liner 104 may be deposited using a suitable technique such as CVD, ALD, or the like. The liner 104 may include a single layer of material or multiple layers comprising different materials.

Figure 22:
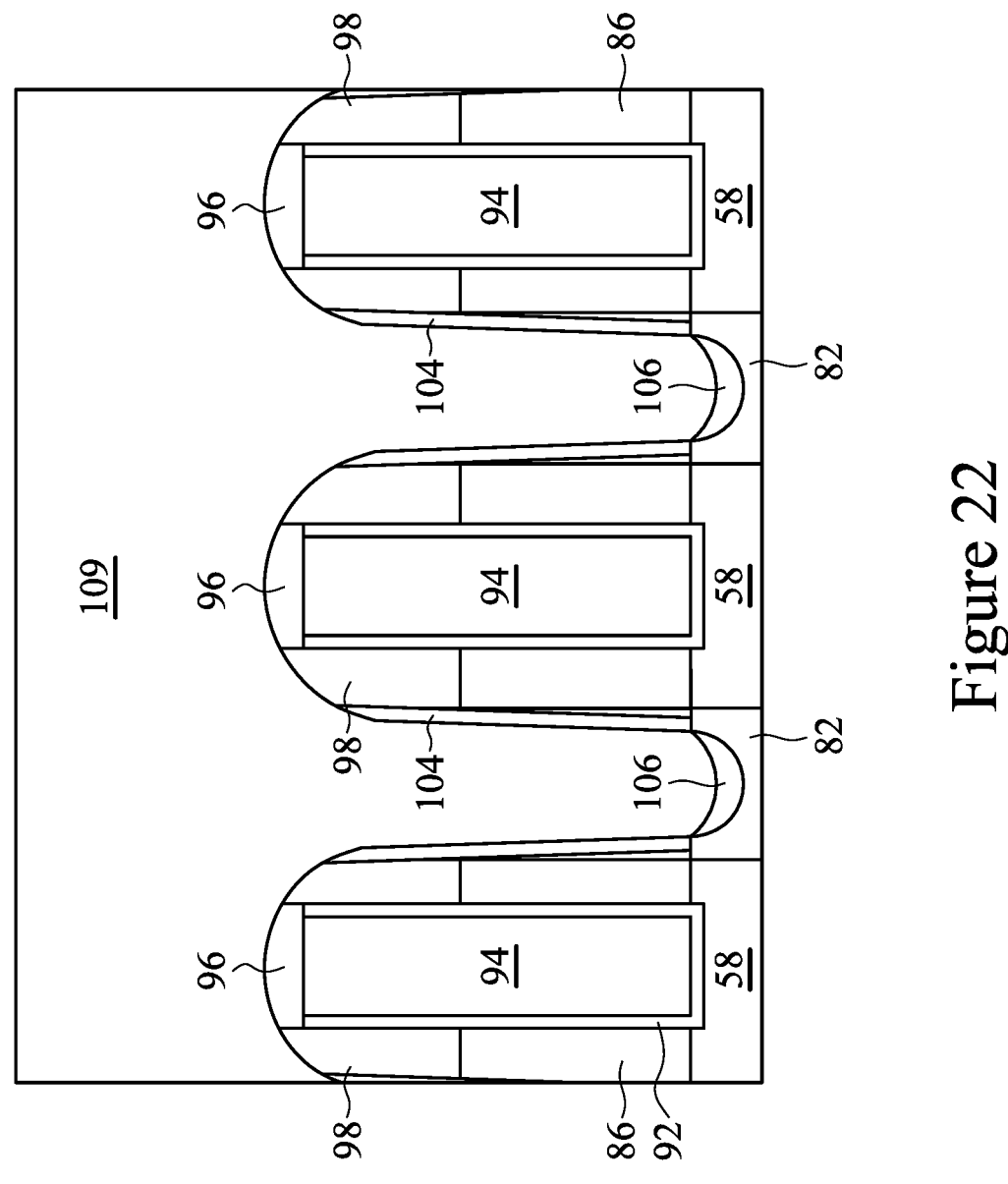

In FIG. 22, silicide regions 106 and a conductive material 109 are formed on the epitaxial source/drain regions 82, in accordance with some embodiments. In some embodiments, the silicide regions 106 are formed by first depositing a metal (not shown) capable of reacting with the semiconductor materials of the underlying epitaxial source/drain regions 82 to form a silicide or germanide. The metal may include, for example, nickel, cobalt, titanium, tantalum, platinum, tungsten, other noble metals, other refractory metals, rare earth metals or their alloys, the like, or a combination thereof. A thermal anneal process may then be performed to form the silicide regions 106. The un-reacted portions of the deposited metal are then removed, e.g., using an etching process. Although silicide regions 106 are referred to as silicide regions, silicide regions 106 may also be germanide regions, silicon germanide regions (e.g., regions comprising silicide and germanide), or the like. The conductive material 109 may comprise one or more layers, such as an optional barrier layer, an optional diffusion layer, and a fill material. For example, a barrier layer may include titanium, titanium nitride, tantalum, tantalum nitride, or the like. The fill material of the conductive material 109 may include copper, a copper alloy, silver, gold, tungsten, cobalt, aluminum, nickel, ruthenium, molybdenum, the like, or a combination thereof.

Figure 23:
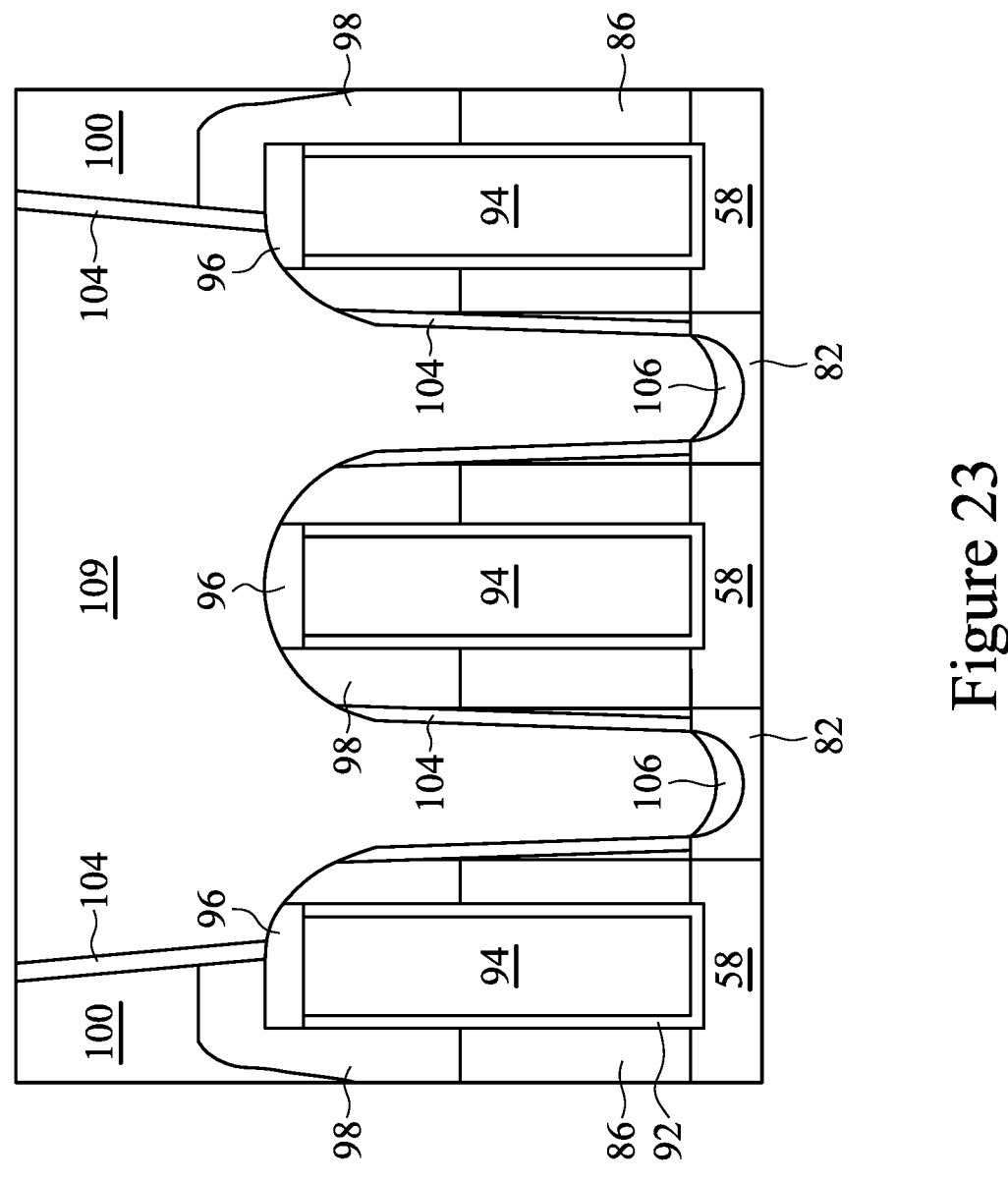

As another example, FIG. 23 illustrates a cross-sectional view similar to FIG. 22 except that the conductive material 109 is formed over a smaller region of the structure. The structure of FIG. 22 may be formed using similar techniques as the structure of FIG. 23, except that the patterned mask layer 103 (see FIG. 19B) may partially extend over some gate stacks such that the dielectric layers 98/100 remain over portions of the gate stacks that are over fins 52. In this manner, the patterning of the mask layer 103 may determine the locations where source/drain contacts 110 (see FIG. 24) are formed, in some embodiments.

Figure 24:
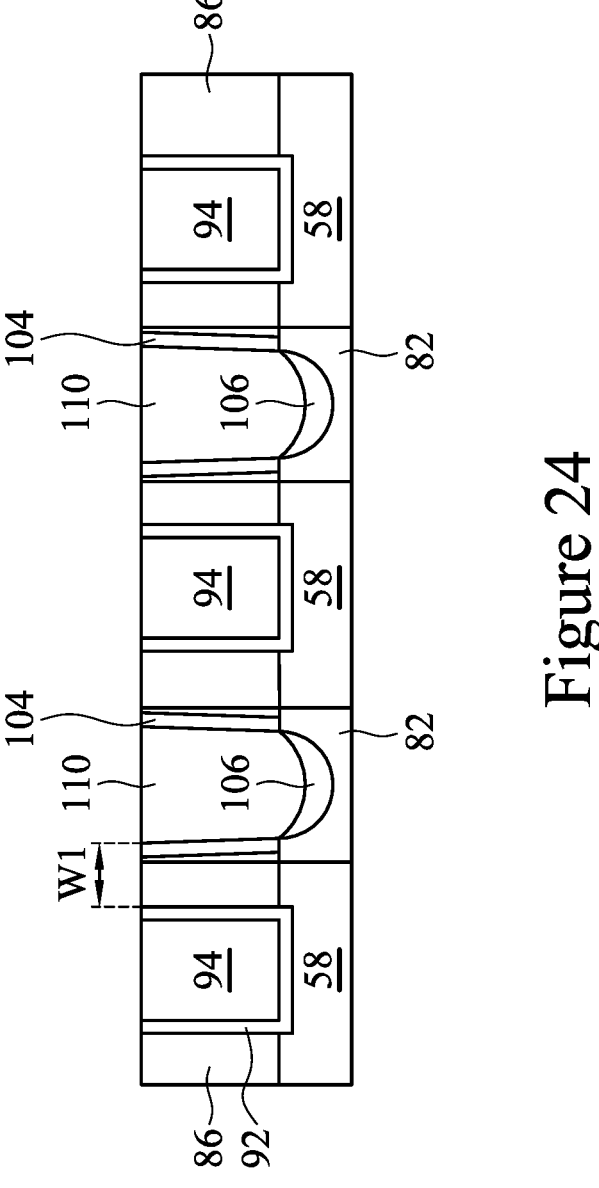

In FIG. 24, a planarization process is performed to remove excess conductive material 109 and form source/drain contacts 110, in accordance with some embodiments. The planarization process may be, for example, a chemical mechanical polish (CMP) process, a grinding process, an etching process, the like, or a combination thereof. After performing the planarization process, top surfaces of the first ILD 88, the gate seal spacers 80, the gate spacers 86, the CESL 87, the gate dielectric layers 92, the gate electrodes 94, the liner 104, and/or the source/drain contacts 110 may be approximately level or coplanar. In some cases, performing a planarization process to form the source/drain contacts 110 as described herein may allow for the width W1 between gate stacks and adjacent source/drain contacts 110 to be reduced without significantly increasing the risk of electrical shorting between gate electrodes 94 and source/drain contacts 110. This can reduce feature pitch and increase device density without negatively impacting yield, in some cases.

In some embodiments, the width W1 may be in the range of about 4 nm to about 20 nm though other widths are possible. In some embodiments, after performing the planarization process, a source/drain contact 110 may have a height in the range of about 4 nm to about 40 nm, though other heights are possible. In some cases, sidewalls of the source/drain contacts 110 may have an angle that is between about 85° and about 90° with respect to the horizontal plane. Other angles or sidewall profiles are possible. In some cases, the techniques described herein allow for the formation of a source/drain contact 110 that is more centered between neighboring gate stacks. In other words, the techniques described herein allow for the formation of self-aligned source/drain contacts 110.

Figure 25:
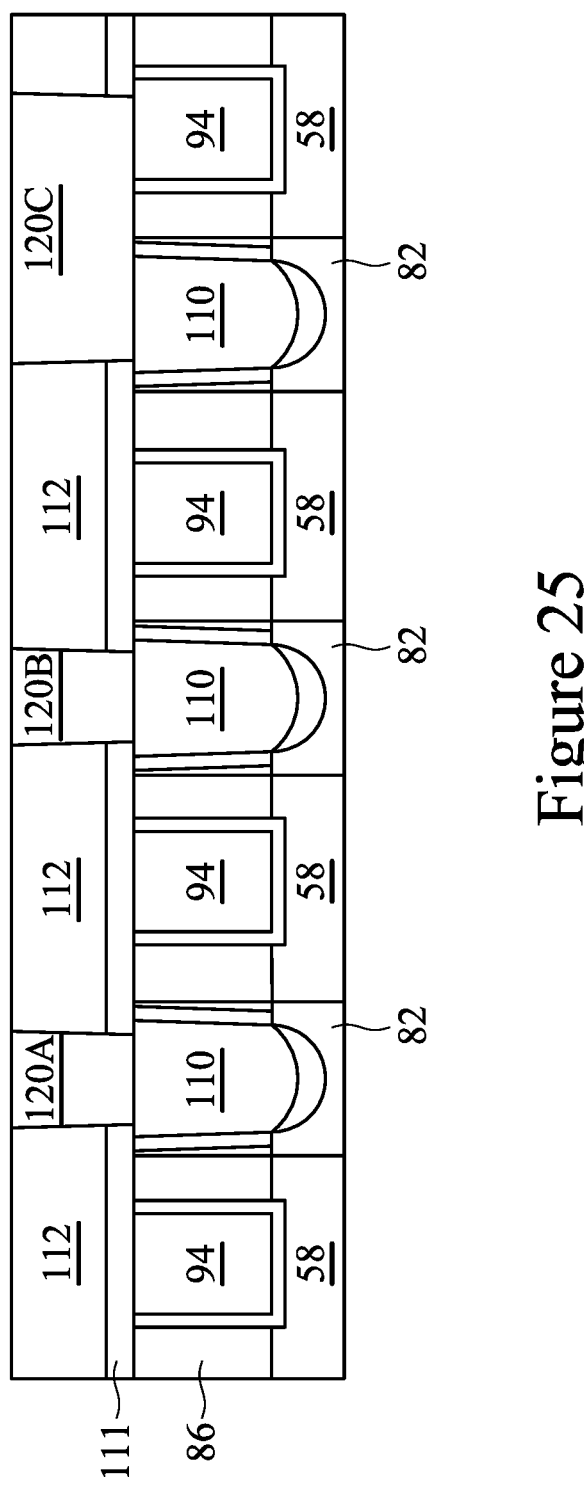
FIGS. 25, 26, 27, 28, and 29 are cross-sectional views of intermediate stages in the manufacturing of conductive features, in accordance with some embodiments.

In FIG. 25, conductive features 120 are formed to electrically contact source/drain contacts 110, in accordance with some embodiments. The conductive features 120 provide electrical connections to respective source/drain regions 82 and in some cases may be considered "source/drain contact plugs," "conductive vias," or the like. FIG. 25 shows three example conductive features 120A, 120B, and 120C that are each electrically connected to a respective source/drain region 82 by a respective source/drain contact 110. In some embodiments, a single conductive feature 120 may electrically connect a source/drain region 82 to an adjacent gate stack. For example, conductive feature 120C shown in FIG. 25 extends over and electrically connects a source/drain contact 110. In other cases, a single conductive feature 120 may electrically connect multiple source/drain regions 82 and/or multiple gate stacks. A conductive feature 120 that electrically connects both source/drain regions 82 and gate stacks may be utilized in various circuits or structures such as an SRAM cell, though other circuits or structures are possible. Although shown as being formed in the same cross-section, it should be appreciated that source/drain contacts 110 and conductive features 120 may be formed in different cross-sections, which may avoid electrical shorting. In some cases, forming the source/drain contacts 110 and the conductive features 120 as described herein can form smaller source/drain contact plugs (e.g., conductive features 120), which can also reduce the risk of electrical shorting between gate electrodes 94 and source/drain contact plugs. This can also increase device density without significantly increased risk of electrical shorting, in some cases. Additionally, the parasitic capacitance between gate electrodes and source/drain contact plugs can be reduced, which can improve device performance and speed.

The conductive features 120 may be formed, for example, by depositing a second ILD 112 and then forming the conductive features 120 extending through the second ILD 112 to physically and electrically contact the source/drain contacts 110 and/or the gate electrodes 94. In some embodiments, an optional etch stop layer 111 may first be deposited over the planarized structure shown in FIG. 24. The etch stop layer 111 may comprise a dielectric material, such as silicon nitride, silicon oxynitride, or the like, which may have a lower etch rate than the material of the overlying second ILD 112. In other embodiments, the etch stop layer 111 may comprise another material such as SiC, AlO, AlON, ZrO, HfO, ZnO, ZrN, ZrAlO, TiO, TaO, YO, TaCN, ZrSi, silicon oxide, SiOCN, SiOC, SiCN, HfSi, LaO, the like, or a combination thereof. The etch stop layer 111 may be deposited using a suitable technique such as CVD, PECVD, ALD, or the like. In some embodiments, the etch stop layer 111 may have a thickness in the range of about 3 nm to about 20 nm, though other thicknesses are possible.

The second ILD 112 is deposited over the etch stop layer 111 (if present), in accordance with some embodiments. The second ILD 112 may comprise one or more materials similar to those described previously for the first ILD 88 or the etch stop layer 111, such as silicon oxide or another material. In some embodiments, the second ILD is a flowable film formed by a flowable CVD method. In some embodiments, the second ILD 112 is formed of a dielectric material such as PSG, BSG, BPSG, USG, or the like. The second ILD 112 may be deposited by any suitable method, such as CVD, FCVD, PECVD, ALD, spin-on, or the like.

The conductive features 120 may be formed by first forming openings (not separately illustrated) that extend through the second ILD 112 and the etch stop layer 111 to expose the epitaxial source/drain regions 82. One or more gate electrodes 94 may also be exposed by the openings, such as for the conductive feature 120C of FIG. 25. The openings may be formed using acceptable photolithography and etching techniques. For example, a photoresist may be formed over the second ILD 112 and patterned. The photoresist can be formed by using, for example, a spin-on technique and can be patterned using acceptable photolithography techniques. One or more suitable etch processes may then be performed using the patterned photoresist as an etch mask to form the openings. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, ruthenium, cobalt, molybdenum, another metal, the like, or a combination thereof.

A planarization process, such as a CMP process, may be performed to remove excess material from top surfaces of the second ILD 112. The remaining liner and conductive material form the conductive features 120 in the openings. In some embodiments, top surfaces of the conductive features 120 and the second ILD 112 are approximately level after planarization. In some embodiments, after planarization, a height of the conductive features 120 is in the range of about 5 nm to about 40 nm, though other heights are possible. In some embodiments, the conductive features 120 are formed having a width in the range of about 5 nm to about 25 nm, though other widths are possible. In some embodiments, after planarization, the second ILD 112 has a thickness in the range of about 3 nm to about 40 nm, though other thicknesses are possible.

Figure 26:
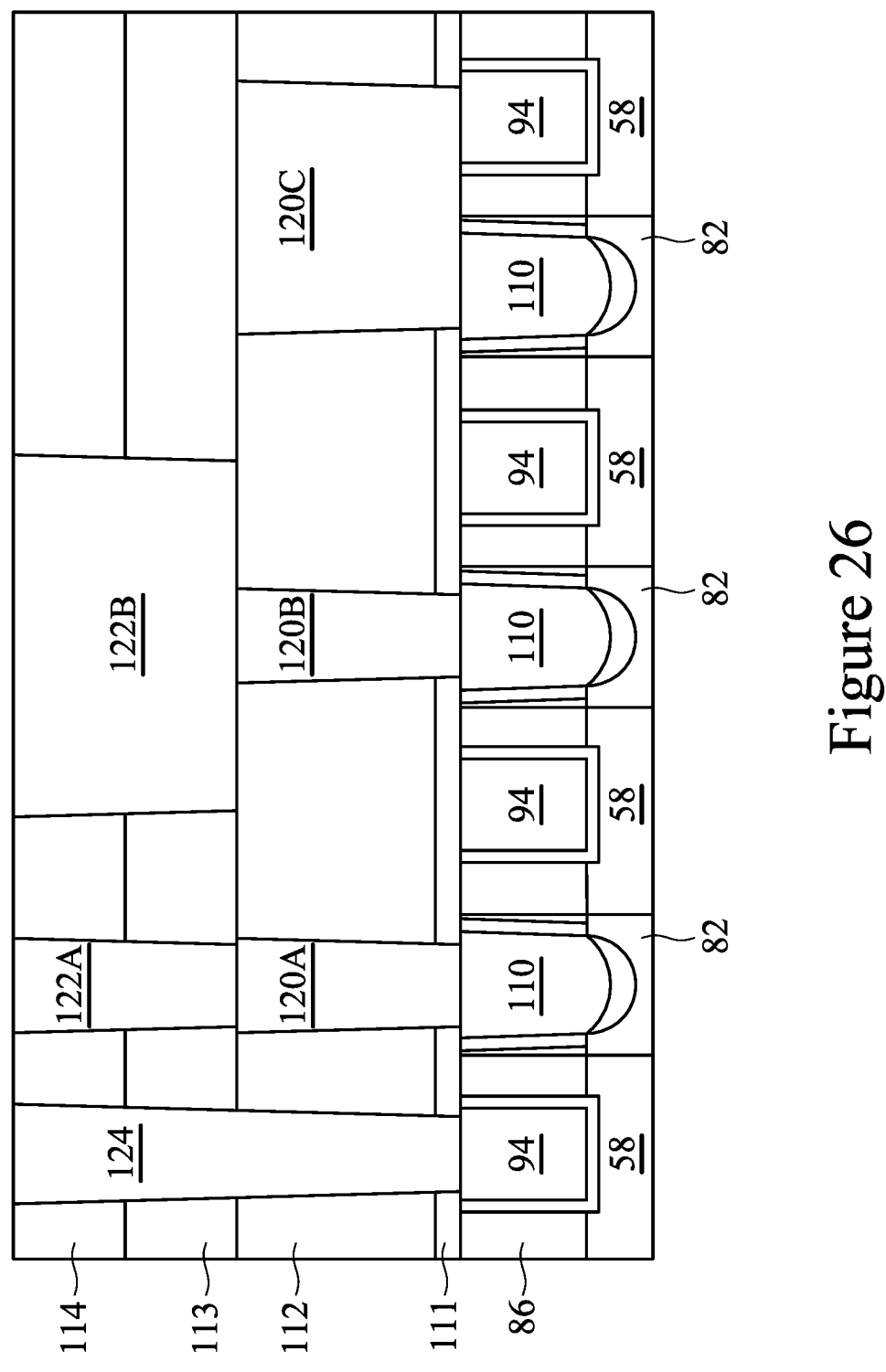

In FIG. 26, conductive features 122 and gate contacts 124 are formed, in accordance with some embodiments. The conductive features 122 provide electrical connections to the conductive features 120. In some embodiments, the conductive features 122 may be conductive lines, conductive vias, conductive rails, or the like, though other features are possible. FIG. 26 shows two example conductive features 122A and 122B that are each electrically connected to a respective source/drain region 82 by conductive features 120A and 120B, respectively. In other embodiments, a single conductive feature 122 may electrically connect multiple source/drain regions 82. The gate contacts 124 provide electrical connections to respective gate electrodes 94 of gate stacks and in some cases may be considered "gate contact plugs" or the like. Although shown as being formed in the same cross-section, it should be appreciated that gate contacts 124 and conductive features 122 may be formed in different cross-sections, which may avoid electrical shorting. In some embodiments, the conductive feature 122A may be, for example, electrically connected to an epitaxial drain region 82, and the conductive feature 122B may be, for example, electrically connected to an epitaxial source region 82. This is an example, and other configurations are possible.

The conductive features 122 may be formed, for example, by depositing a third ILD 114 and then forming the conductive features 122 extending through the third ILD 114 to physically and electrically contact the conductive features 120. The gate contacts 124 are formed extending through the third ILD 114 and the second ILD 112 to physically and electrically contact respective gate electrodes 94. In some embodiments, an optional etch stop layer 113 may first be deposited over second ILD 112 and the conductive features 120. The etch stop layer 113 may be formed using similar materials or techniques as described previously for the etch stop layer 111. The third ILD 114 may then be deposited on the etch stop layer 113. The third ILD 114 may be formed using similar materials or techniques as described previously for the second ILD 112.

The conductive features 122 may be formed by first forming openings (not separately illustrated) that extend through the third ILD 114 and the etch stop layer 113 to expose the conductive features 120. The openings may be formed using acceptable photolithography and etching techniques. A liner and a conductive material may then be deposited in the openings to form the conductive features 122. The liner and the conductive material may be similar to those described previously for the conductive features 120. The gate contacts 124 may be formed by forming openings (not separately illustrated) that extend through the third ILD 114, the etch stop layer 113, the second ILD 112, and the etch stop layer 111 to expose the gate electrodes 94. The openings may be formed using acceptable photolithography and etching techniques. A liner and a conductive material may then be deposited in the openings to form the gate contacts 124. The liner and the conductive material may be similar to those described previously for the conductive features 120. Some of the steps used to form the conductive features 122 may be simultaneous with steps used to form the gate contacts 124, in some embodiments. In other embodiments, the conductive features 122 and the gate contacts 124 are formed using separate steps.

A planarization process, such as a CMP process, may be performed to remove excess material from top surfaces of the third ILD 114. In some embodiments, top surfaces of the conductive features 122, the gate contacts 124, and the third ILD 114 are approximately level after planarization. In some embodiments, after planarization, a height of the conductive features 122 is in the range of about 5 nm to about 40 nm, though other heights are possible. In some embodiments, the conductive features 122 are formed having a width in the range of about 5 nm to about 25 nm, though other widths are possible. A width of a conductive feature 122 may be greater than, less than, or about the same as a width of an underlying conductive feature 120. In some embodiments, the gate contacts 124 are formed having a width in the range of about 5 nm to about 25 nm, though other widths are possible. In some embodiments, after planarization, the third ILD 114 has a thickness in the range of about 3 nm to about 40 nm, though other thicknesses are possible.

Figure 27:
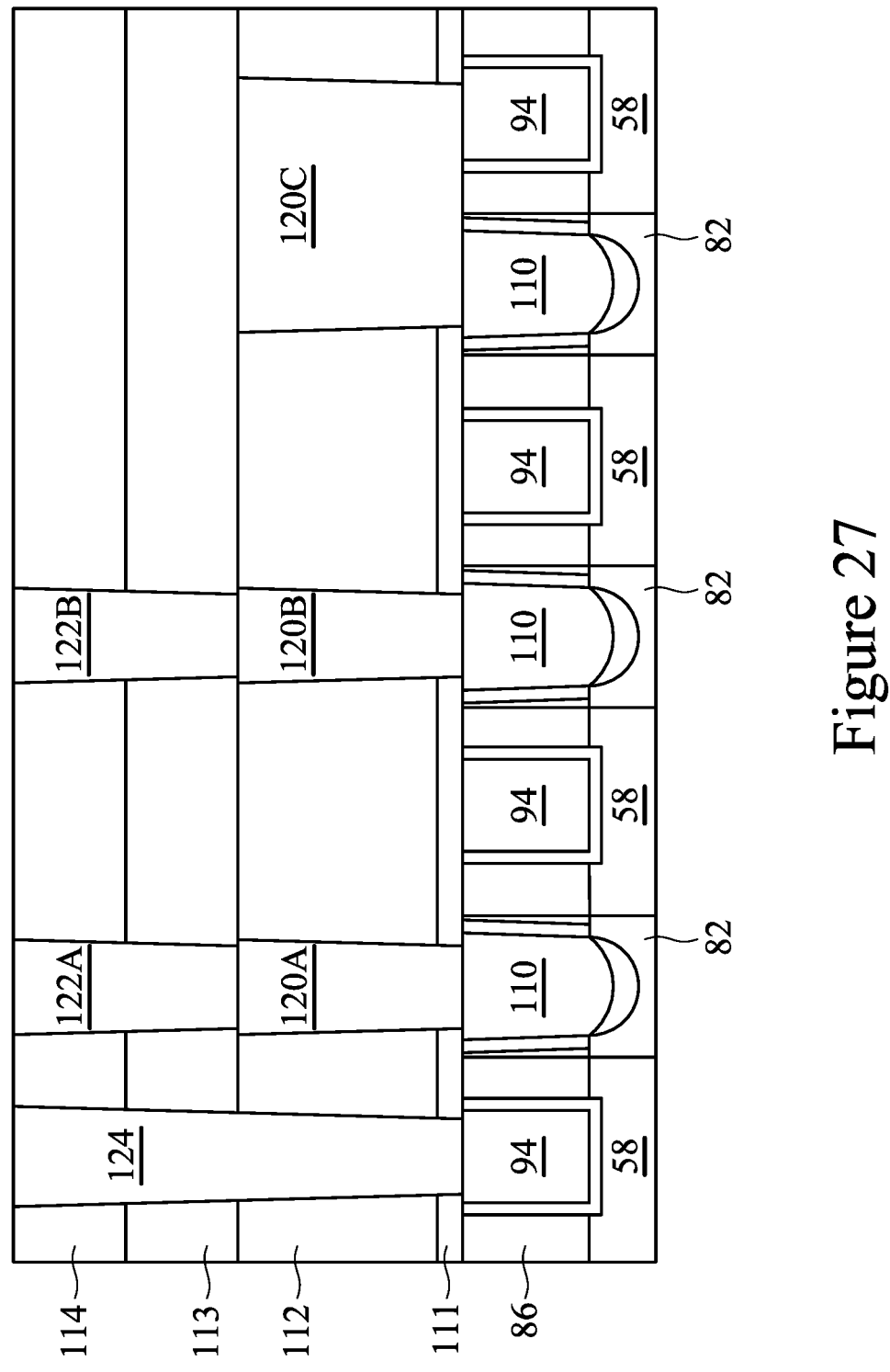

As shown in FIG. 26, the conductive features 122 may have different widths. For example, the width of the conductive feature 122A in FIG. 26 is smaller than the width of the conductive feature 122B. In some cases, the conductive features 122 that have a relatively larger width (e.g., conductive features 122B) may be considered as having a "slot profile." Other widths or relative widths are possible. In some cases, a larger width may reduce the contact resistance of a conductive feature 122. However, in some cases, the conductive features 122 may have similar sizes. This is shown in the embodiment of FIG. 27, which is similar to the embodiment of FIG. 26 except that the conductive features 122A and 122B have similar widths. In some embodiments, widths of the conductive features 122A and 122B may be similar to widths of the underlying conductive features 120A and 120B. In other embodiments, widths of the conductive features 122A and 122B may be greater than or less than widths of the underlying conductive features 120A and 120B. In some embodiments, forming conductive features 122 having smaller widths may reduce the risk of electrical shorting and reduce parasitic capacitance, which can improve device yield and device performance. In other embodiments, the conductive features 120 may be formed having different widths, examples of which are described below for FIGS. 30A-30C.

Figure 28:
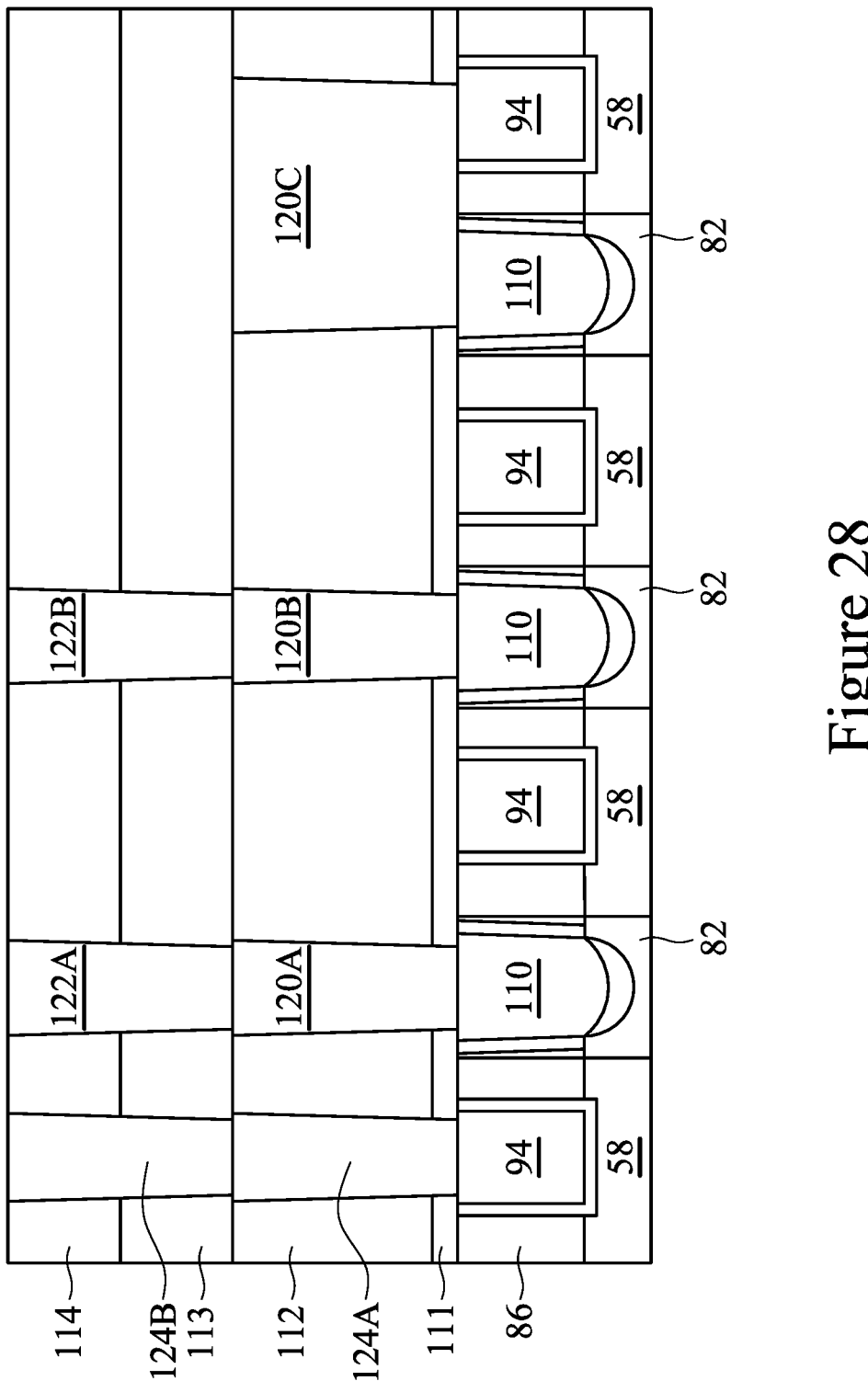

FIG. 28 illustrates an embodiment similar to the embodiment of FIG. 27 except that the gate contact 124 is formed from two conductive features 124A and 124B, rather than from a single conductive feature. In other words, in FIG. 28, the gate contact 124 comprises a conductive feature 124A formed in the second ILD 112 and a conductive feature 124B formed in the third ILD 114, rather than a single conductive feature extending through both the second ILD 112 and the third ILD 114. The conductive feature 124A may be formed simultaneously with the conductive features 120 and may be formed using similar materials or techniques as the conductive features 120. The conductive feature 124B may be formed simultaneously with the conductive features 122 and may be formed using similar materials or techniques as the conductive features 122. In some embodiments, widths of the conductive features 124A-B may be smaller than widths of the conductive features 120 or 122. In some embodiments, a width of the conductive feature 124A may be greater than a width of the overlying conductive feature 124B, which can reduce contact resistance, in some cases. In some embodiments, the conductive features 124A-B are formed having a width in the range of about 5 nm to about 25 nm, though other widths are possible.

Figure 29:
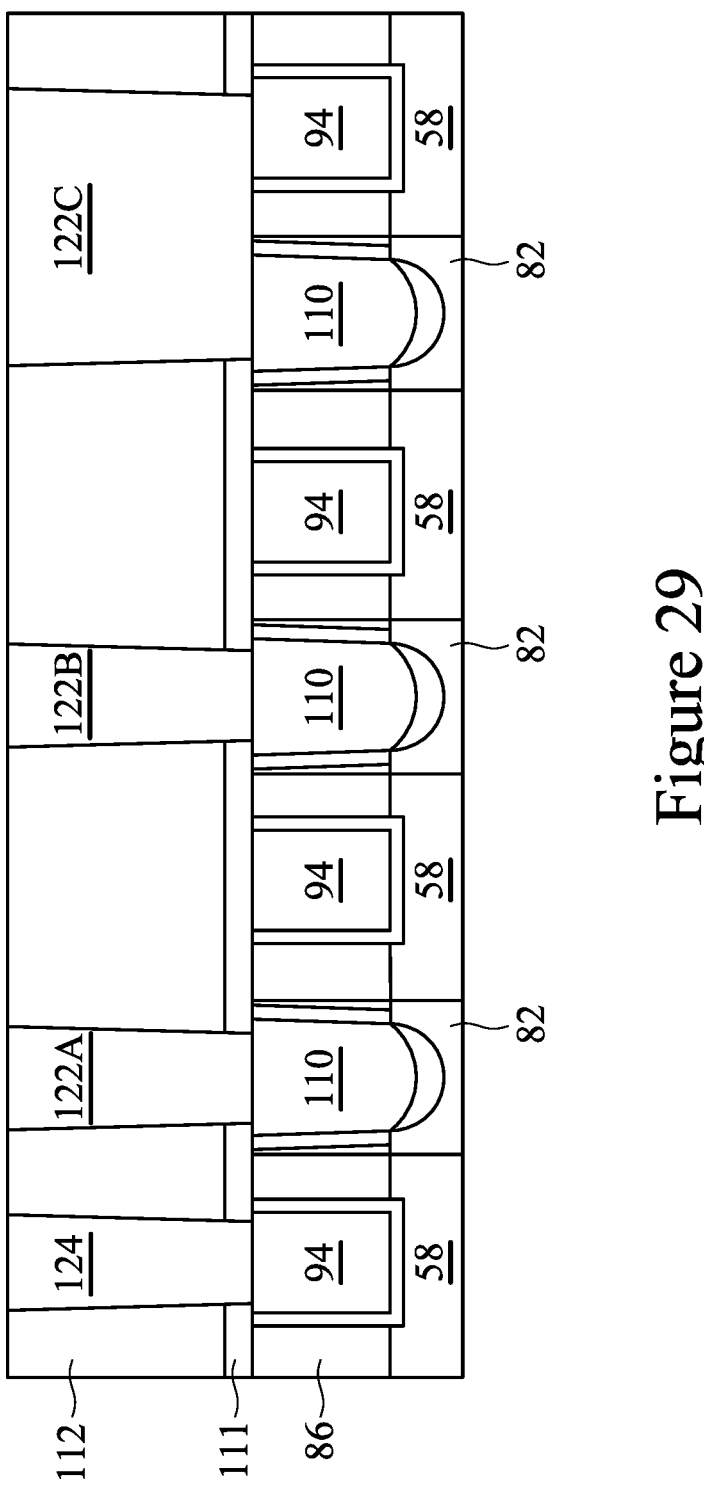

In some embodiments, the conductive features 120 are not formed. This is shown in the embodiment of FIG. 29, in which the conductive features 122 and the gate contacts 124 are formed in the second ILD 112 rather than in the third ILD 114. The conductive features 122 extend through the second ILD 112 to physically and electrically contact the source/drain regions 82. In such embodiments, the third ILD 114 may be omitted, in some cases. Additionally, the thickness of the second ILD 112 may be greater than for embodiments in which the third ILD 114 is formed. In some cases, forming the conductive features 122 without forming the conductive features 120 can reduce the number of process steps and reduce manufacturing cost.

Figure 30C:
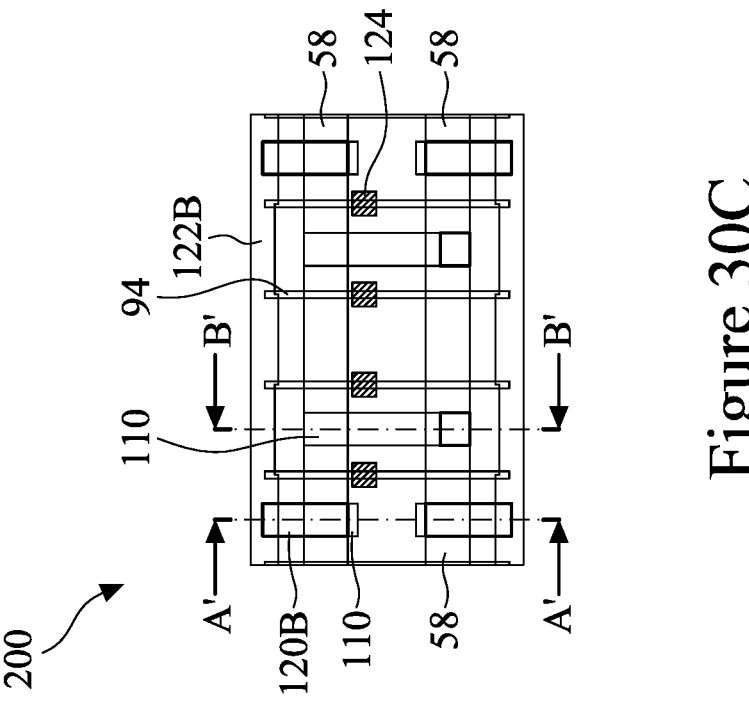
FIGS. 30A, 30B, 30C are various views of intermediate stages in the manufacturing of conductive features, in accordance with some embodiments.
Figure 30A:
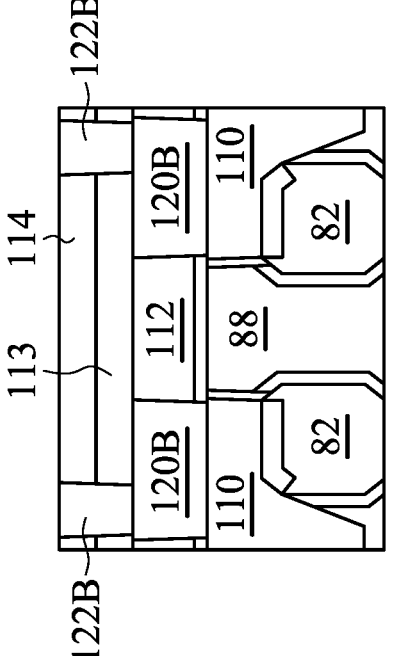
Figure 30B:
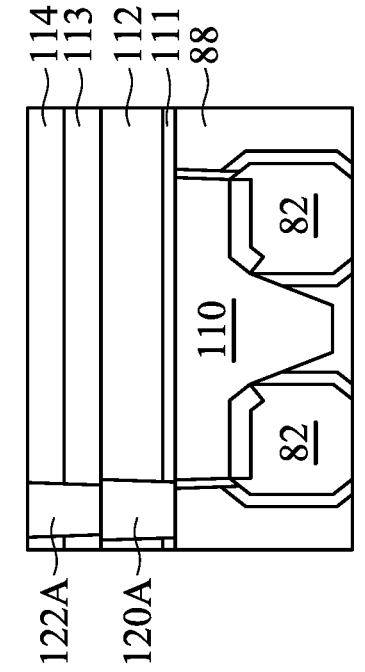

FIGS. 30A, 30B, and 30C illustrate source/drain contacts 110, conductive features 120A-B, and conductive features 122A-B of a circuit structure 200, in accordance with some embodiments. FIG. 30C illustrates a schematic plan view of the circuit structure 200, in accordance with some embodiments. FIG. 30A illustrates a cross-sectional view similar to that indicated by cross-section A'-A' in FIG. 30C. FIG. 30B illustrates a cross-sectional view similar to that indicated by cross-section B'-B' in FIG. 30C. The circuit structure 200 comprises multiple FinFET devices, which may be formed using techniques similar to those described for FIGS. 2 through 29. For example, the circuit structure 200 includes source/drain regions 82 and gate electrodes 94 formed over fins 52. The source/drain regions 82 are electrically connected to source/drain contacts 110 and conductive features 120/122, and the gate electrodes 94 are electrically connected to gate contacts 124. The circuit structure 200 comprises conductive features 120A having a relatively small width and conductive features 120B having a relatively large width. In some cases, the source/drain contacts 110 may have a width larger than a width of overlying conductive features 120/122. The source/drain contacts 110 may electrically connect multiple source/drain regions 82, as shown in FIG. 30B. The circuit structure 200 is an illustrative example, and other circuits, devices, configurations, or arrangements are possible.

FIG. 30A illustrates a cross-section A'-A' in which the conductive features 120B have a relatively large width. In some cases, the conductive features 120B may be considered as having a "slot profile." Forming conductive features 120B that have a relatively large width may reduce resistance, in some cases. For example, conductive features 120B having a relatively large width may be used for lower-resistance electrical connections to source regions 82, in some cases. In some embodiments, the conductive features 120B may have a width in the range of about 5 nm to about 60 nm, though other widths are possible.

FIG. 30B illustrates a cross-section B'-B' in which the conductive features 120A have a relatively small width. In some cases, the conductive features 120A may be considered as having a "hole profile." Forming conductive features 120A that have a relatively small width may reduce parasitic capacitance, in some cases. For example, conductive features 120A having a relatively small width may be used for lower-capacitance electrical connections to drain regions 82, in some cases. In some embodiments, the conductive features 120A may have a width in the range of about 5 nm to about 25 nm, though other widths are possible.

Figure 31C:
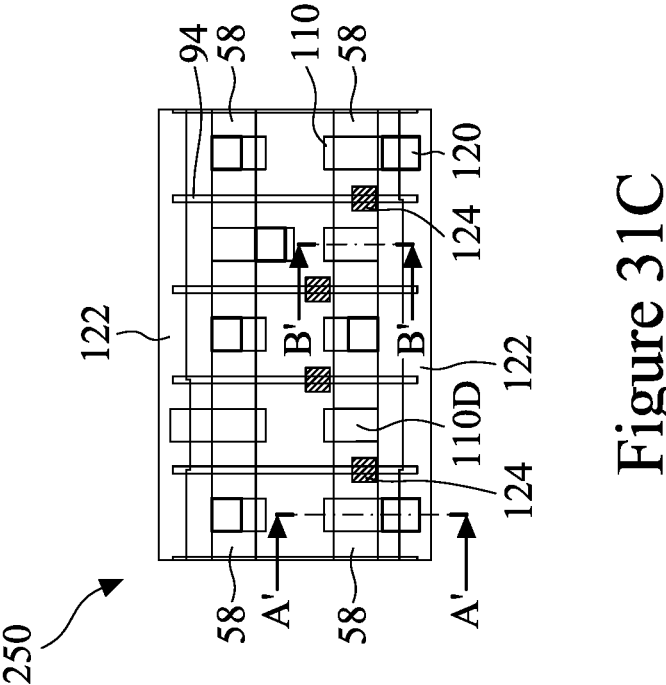
FIGS. 31A, 31B, 31C are various views of intermediate stages in the manufacturing of conductive features, in accordance with some embodiments.
Figure 31A:
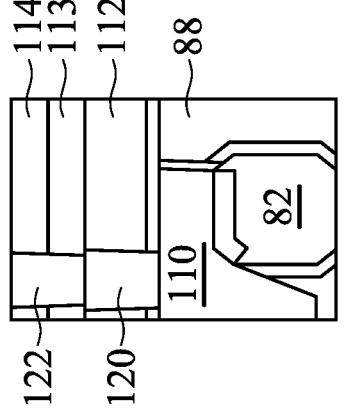
Figure 31B:
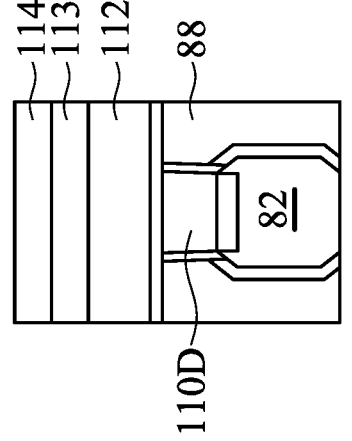

FIGS. 31A, 31B, and 31C illustrate source/drain contacts 110, dummy source/drain contacts 110D, conductive features 120, and conductive features 122 of a circuit structure 250, in accordance with some embodiments. FIG. 31C illustrates a schematic plan view of the circuit structure 250, in accordance with some embodiments. FIG. 31A illustrates a cross-sectional view similar to that indicated by cross-section A'-A' in FIG. 31C. FIG. 31B illustrates a cross-sectional view similar to that indicated by cross-section B'-B' in FIG. 31C. The circuit structure 250 comprises multiple FinFET devices, which may be formed using techniques similar to those of the circuit structure 250 or those described for FIGS. 2 through 29. For example, the circuit structure 200 includes source/drain regions 82 and gate electrodes 94 formed over fins 52. The source/drain regions 82 are electrically connected to source/drain contacts 110 and conductive features 120/122, and the gate electrodes 94 are electrically connected to gate contacts 124. The circuit structure 250 is an illustrative example, and other circuits, devices, configurations, or arrangements are possible.

FIG. 31A illustrates a cross-section A'-A' in which the conductive features 120 are formed having a relatively small width (e.g., a "hole profile"). In some cases, the conductive features 120 may be formed having a relatively small width to reduce the risk of electrical shorting between the conductive features 120 and the gate contacts 124. For example, the conductive features 120 may be formed having a relatively small width when the arrangement of the circuit structure locates the conductive features 120 near gate contacts 124, as for the example circuit structure 250 shown in FIG. 31C. FIG. 31B illustrates a cross-section B'-B' in which a dummy source/drain contact 110D is formed on a source/drain region 82. For example, no conductive feature 120 is formed on the dummy source/drain contact 110D.

FIGS. 32 through 39 illustrate intermediate steps in the formation of FinFET devices, in accordance with some embodiments. Some materials and steps may be similar to those previously described for FIGS. 2 through 26, and accordingly some details may not be repeated below. The techniques described in FIGS. 32-39 may be performed on a structure similar to the structure shown in FIG. 17. The techniques described in FIGS. 32-39 may form devices or structures similar to those described previously for FIGS. 26-31C, in some cases.

Figure 32:
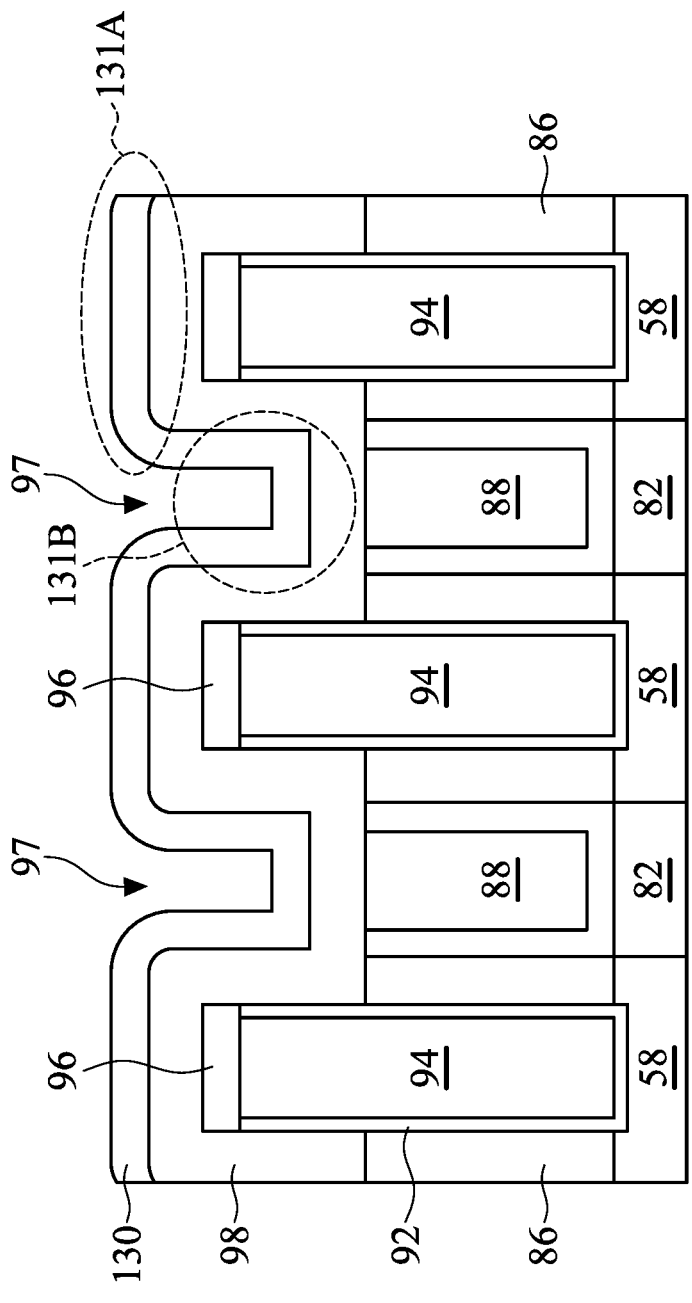
FIGS. 32, 33, 34, 35, 36, 37, 38, and 39 are cross-sectional views of intermediate stages in the manufacturing of FinFETs, in accordance with some embodiments.

In FIG. 32, an amorphous silicon layer 130 is deposited over the structure shown in FIG. 17, in accordance with some embodiments. For example, the amorphous silicon layer 130 may be conformally deposited on the dielectric layer 98, including surfaces of the dielectric layer 98 within the recesses 97. The amorphous silicon layer 130 may be conformally deposited using a suitable technique, such as CVD, PECVD, or the like. The amorphous silicon layer 130 may be formed having a thickness in the range of about 2 nm to about 15 nm, though other thicknesses are possible.

In some embodiments, an implantation process may be performed on the amorphous silicon layer 130. The implantation process may implant dopants into upper surfaces of the amorphous silicon layer 130. For example, implanting the dopants may form higher-doped regions of the amorphous silicon layer 130 outside the recesses 97 and lower-doped (or dopant-less) regions of the amorphous silicon layer 130 within the recesses 97. As an example, the portions of the amorphous silicon layer 130 within the indicated region 131A may have higher doping than the portions of the amorphous silicon layer 130 within the indicated region 131B, after performing the implantation process. The implanted dopants may comprise dopant species such as carbon, nitrogen, boron, or the like. The higher-doped regions of the amorphous silicon layer 130 may have a doping concentration in the range of about 1E20 cm$^{-3}$ to about 2E21 cm$^{-3}$, though other concentrations are possible. In some embodiments, the implantation process may comprise an implantation energy in the range of about 0.1 keV to about 10 keV, though other energies are possible. In some embodiments, the implantation process may be performed at an angle that is oblique with respect to the horizontal plane.

Figure 33:
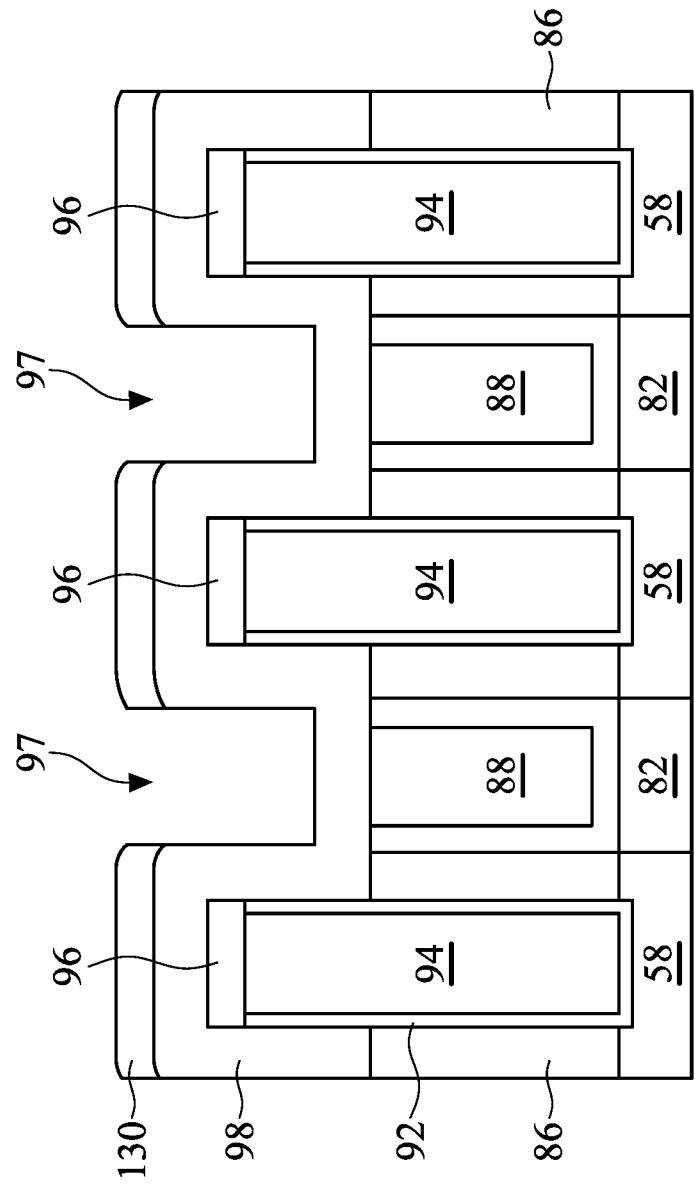

In FIG. 33, a selective etching process is performed to remove lower-doped regions of the amorphous silicon layer 130, in accordance with some embodiments. The selective etching process may include a wet etching process, a dry etching process, or a combination thereof. For example, in some embodiments, the selective etching process may include a wet etchant such as NH$_4$OH, KOH, SC–1, the like, or another suitable wet etchant. Having a lower doping, the portions of the amorphous silicon layer 130 within the recesses 97 may be removed by the selective etching process. After performing the selective etching process, higher-doped portions of the amorphous silicon layer 130 remain over top surfaces of the dielectric layer 98. The remaining higher-doped portions of the amorphous silicon layer 130 may protect the dielectric layer 98 during subsequent etching steps, and may be used as an etch mask. In this manner, some subsequent etching processes may have more vertical sidewalls or allow for smaller feature sizes.

Figure 34:
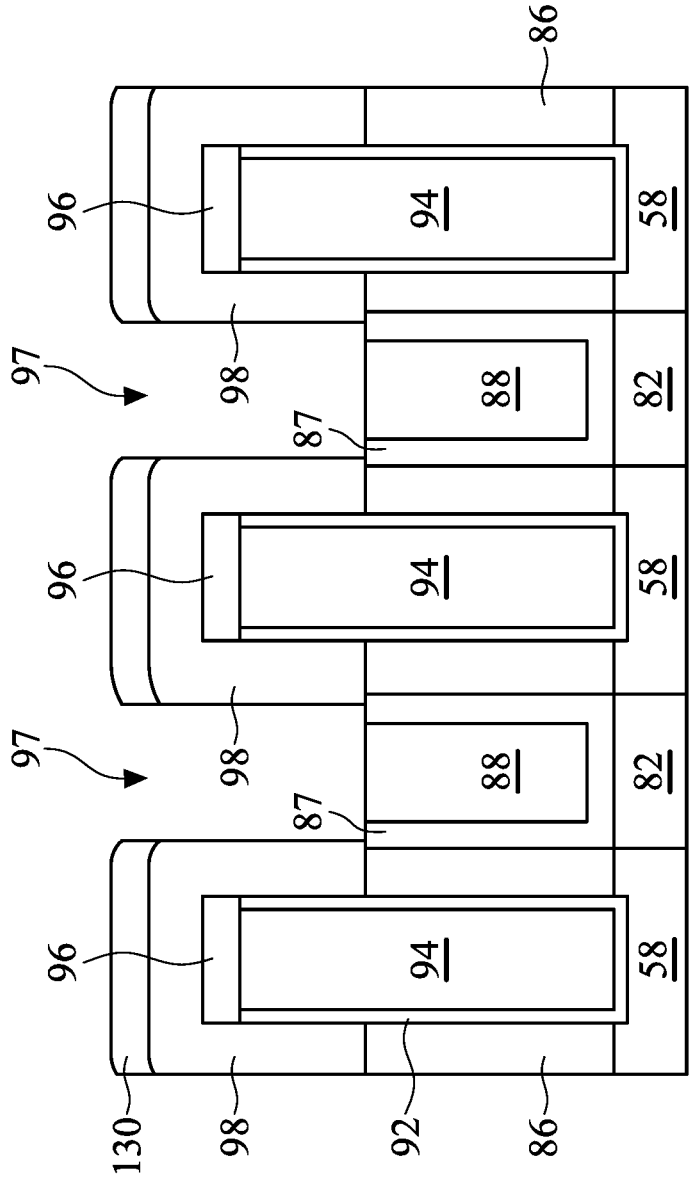

In FIG. 34, an etching process is performed to remove portions of the dielectric layer 98 and expose the first ILD 88 within the recesses 97, in accordance with some embodiments. The CESL 87 may also be exposed, in some embodiments. The etching process may include a wet etching process, a dry etching process, or a combination thereof. The etching process may be anisotropic. In some embodiments, the etching process uses the remaining portions of the amorphous silicon layer 130 as an etch mask to extend the recesses 97 through the dielectric layer 98 to the first ILD 88.

Figure 35:
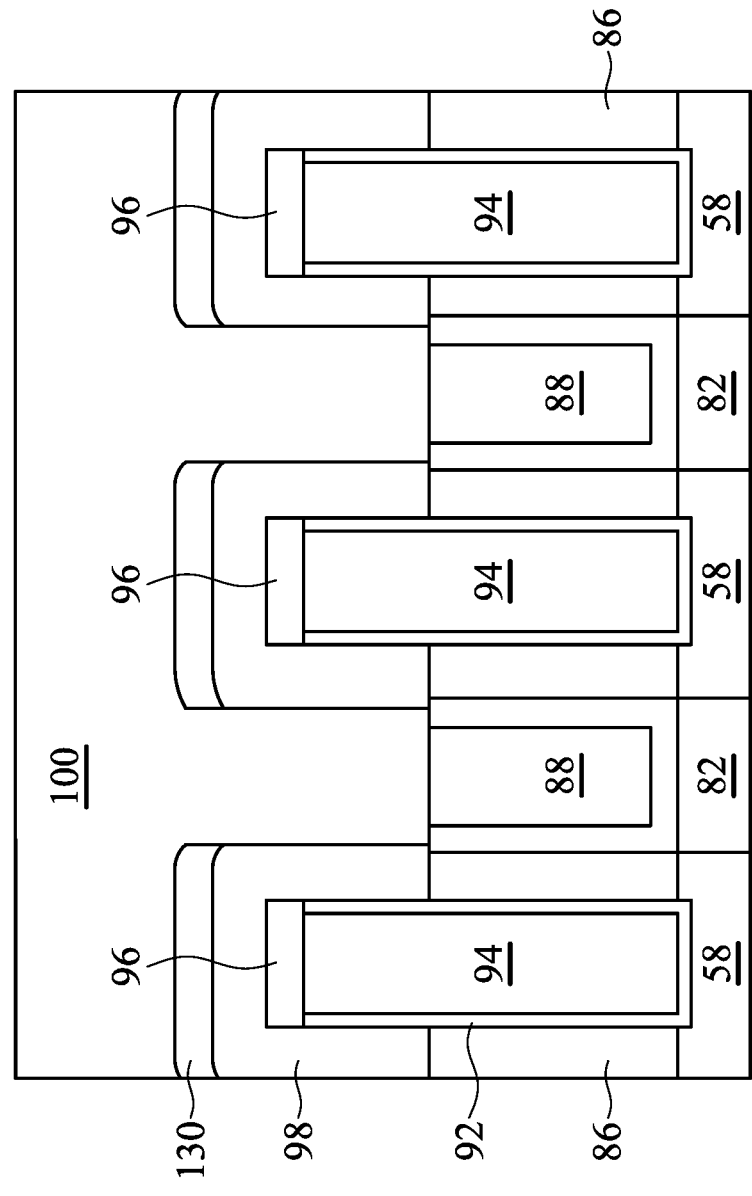

In FIG. 35, a dielectric layer 100 is deposited over the structure. The dielectric layer 100 may be similar to the dielectric layer 100 described previously for FIG. 18, and may be formed using similar techniques. Unlike the embodiment of FIG. 18, the dielectric layer 100 of FIG. 35 is deposited onto a top surface of the first ILD 88.

Figure 36:
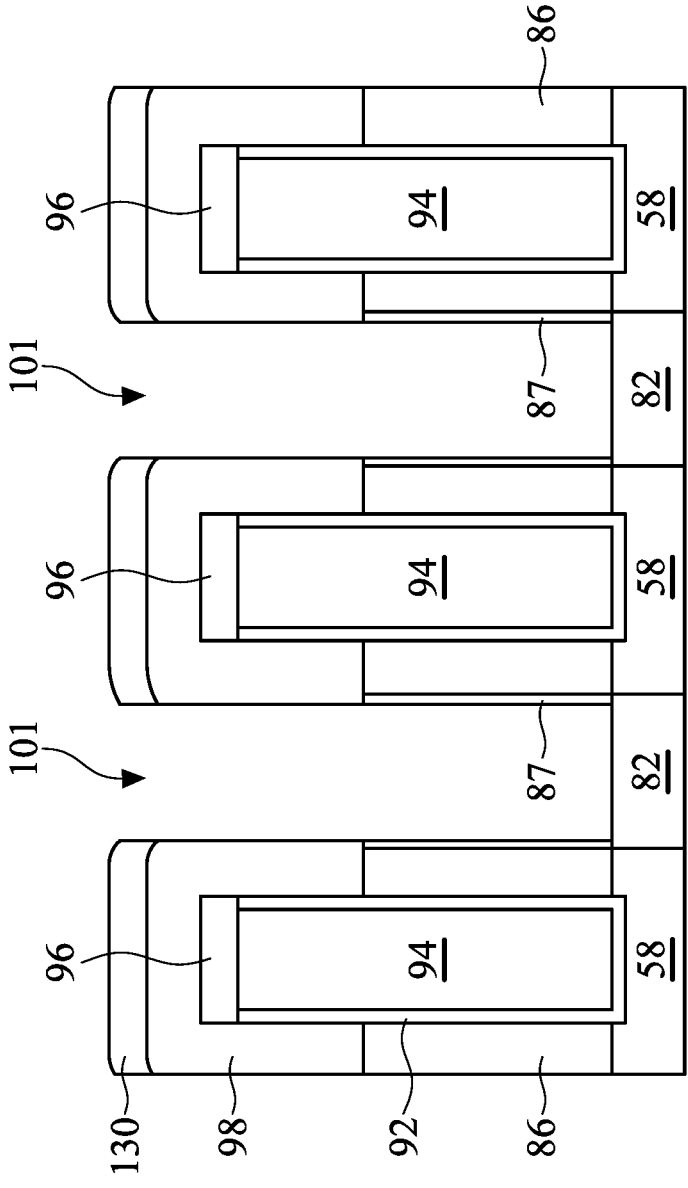

In FIG. 36, an etching process is performed to etch recesses 101 in the dielectric layers 100 and first ILD 88, in accordance with some embodiments. The etching process may also remove portions of the CESL 87, in some embodiments. The etching process exposes the source/drain regions 82 within the recesses 101, similar to the step shown in FIG. 20. The etching process may be performed using the remaining portions of the amorphous silicon layer 130 as an etch mask to form recesses 101. The etching process may include one or more etching steps and may include a wet etching process, a dry etching process, or a combination thereof. The etching process may be anisotropic. The etching process may be similar to the etching process described previously for FIG. 19A and/or FIG. 20, in some embodiments. In some cases, using the amorphous silicon layer 130 as an etch mask as described herein can allow for the formation of recesses 101 that are approximately centered between adjacent gate stacks.

Figure 37:
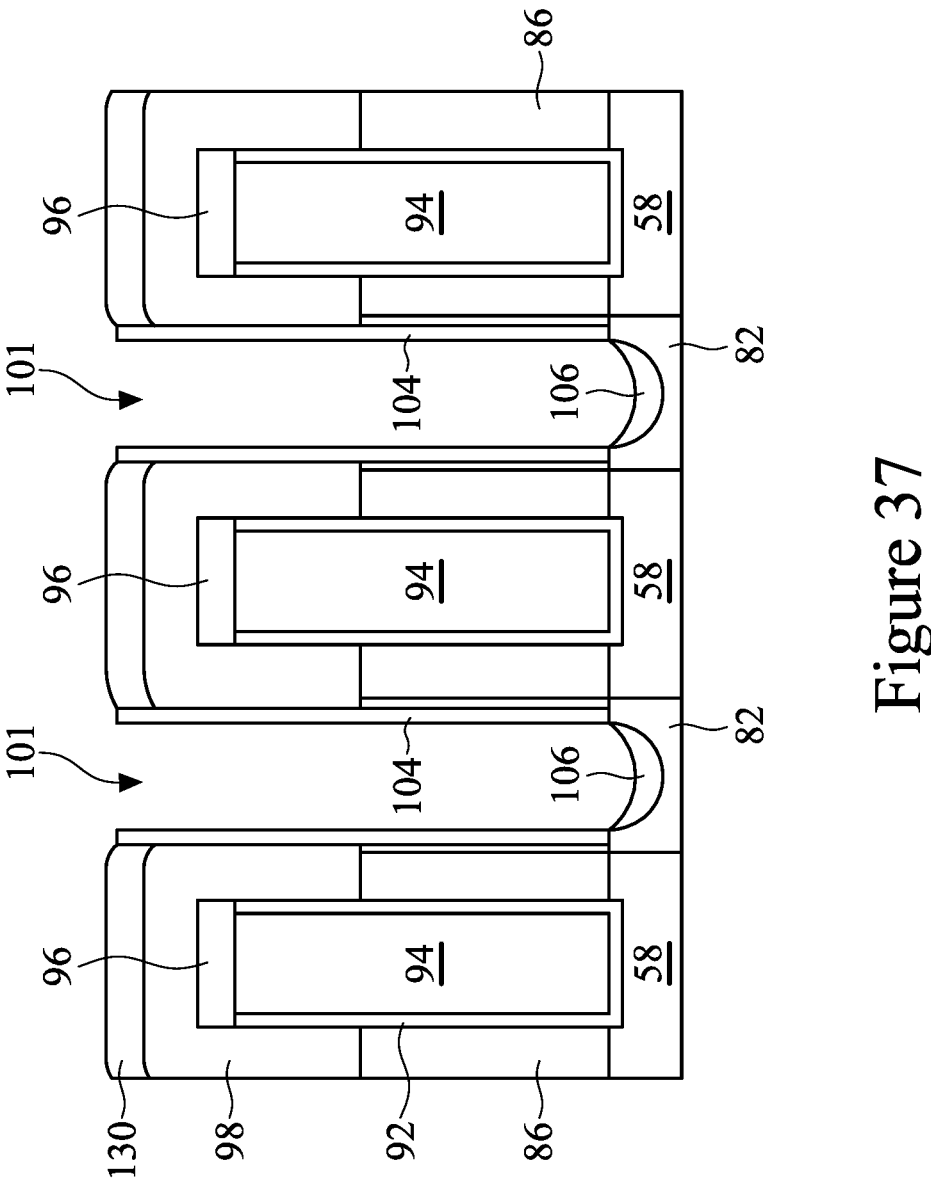

In FIG. 37, a liner 104 and silicide regions 106 are formed, in accordance with some embodiments. The liner 104 may be deposited on sidewalls of the recesses 101, as shown in FIG. 37. The liner 104 may be formed using materials or techniques similar to those described for the liner 104 of FIG. 21. For example, in some embodiments, the material of the liner 104 is silicon nitride. As another example, in some embodiments, the material of the liner 104 may be deposited and then etched to remove the material of the liner 104 from top surfaces or lateral surfaces. Other materials or techniques are possible.

Further in FIG. 37, silicide regions 106 are formed on the source/drain regions 82, in accordance with some embodiments. The silicide regions 106 may be formed using materials or techniques similar to those described previously for the silicide regions 106 of FIG. 22. The silicide regions 106 may be formed before the liner 104, after the liner 104, or concurrently with the conductive material that forms the source/drain contacts 110 (see FIG. 38).

Figure 38:
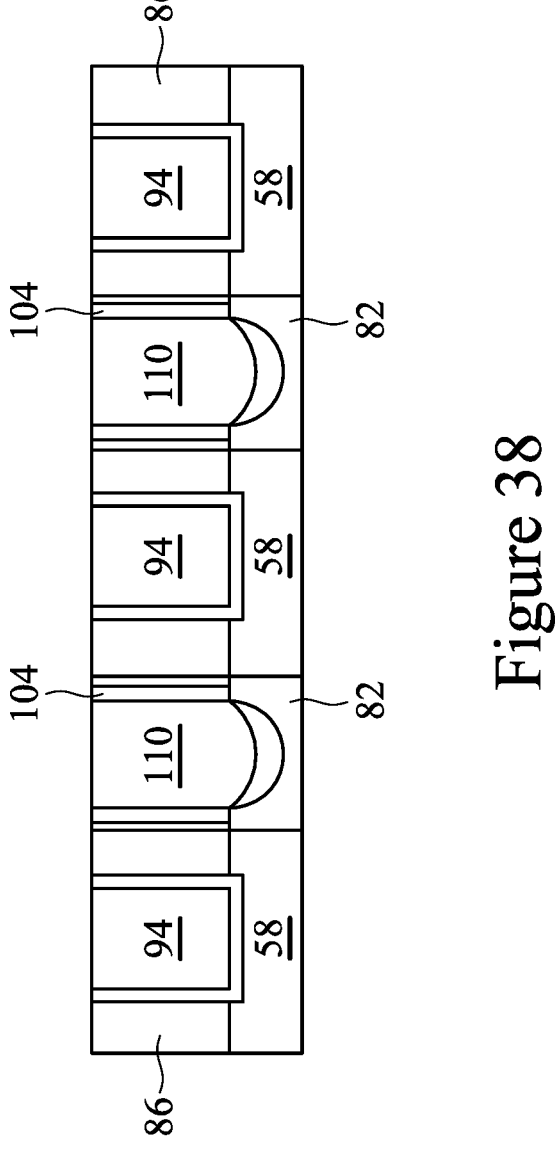

In FIG. 38, a conductive material is deposited in the recesses 101 and a planarization process is performed to form source/drain contacts 110, in accordance with some embodiments. The conductive material may be similar to the conductive material 109 described previously for FIG. 22. The planarization process may be, for example, a chemical mechanical polish (CMP) process, a grinding process, an etching process, the like, or a combination thereof. After performing the planarization process, top surfaces of the first ILD 88, the gate seal spacers 80, the gate spacers 86, the CESL 87, the gate dielectric layers 92, the gate electrodes 94, the liner 104, and/or the source/drain contacts 110 may be approximately level or coplanar. In some cases, performing a planarization process to form the source/drain contacts 110 as described herein may allow for the width between gate stacks and adjacent source/drain contacts 110 to be reduced without significantly increasing the risk of electrical shorting between gate electrodes 94 and source/drain contacts 110. This can reduce feature pitch and increase device density without negatively impacting yield, in some cases.

Figure 39:
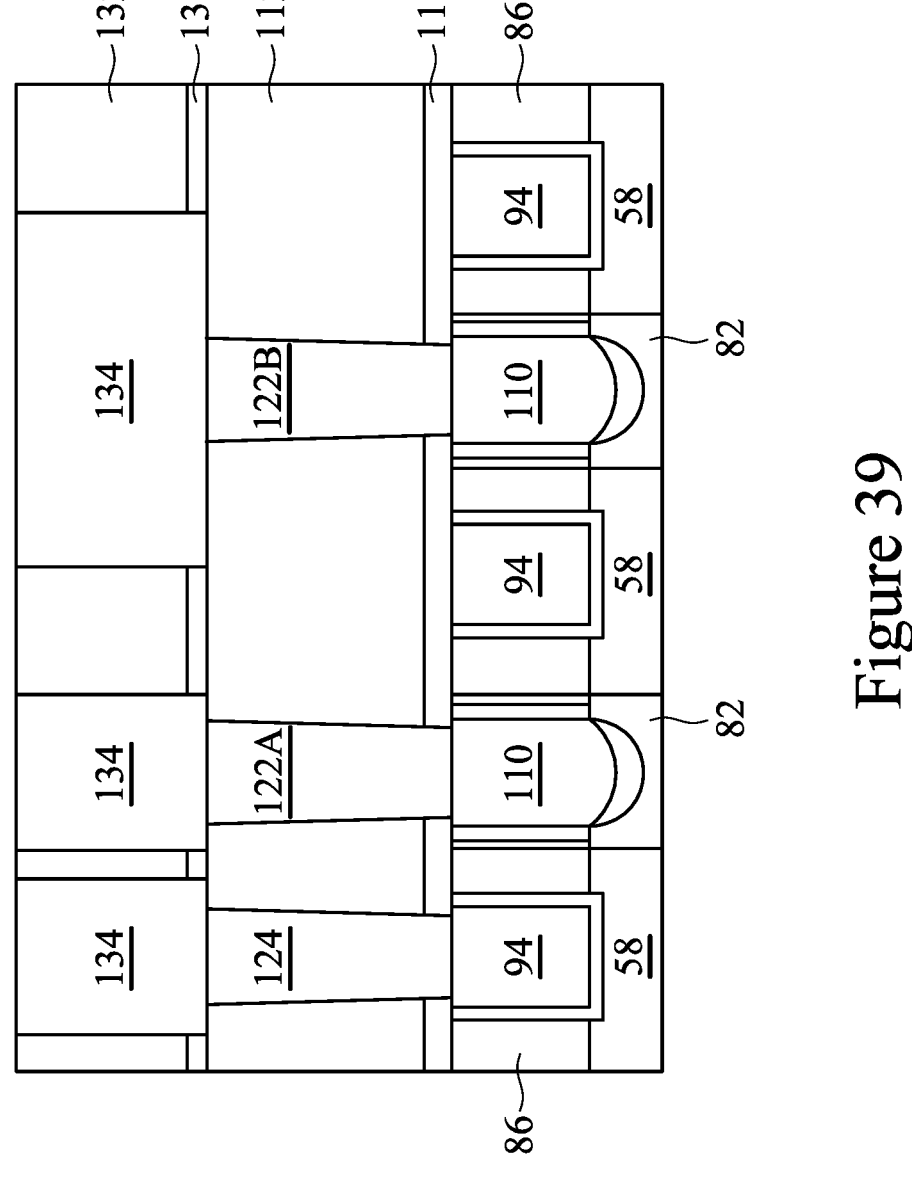

In FIG. 39, conductive features 122 and gate contacts 124 are formed, in accordance with some embodiments. The conductive features 122 and gate contacts 124 may be similar to those described previously for FIGS. 26-29 and may be formed using similar techniques. For example, the conductive features 122 physically and electrically contact source/drain contacts 110, and the gate contacts 124 physically and electrically contact gate electrodes 94. As shown in FIG. 39, the conductive features 122 may be formed in the second ILD 112, and thus in some embodiments the conductive features 120 are not formed, similar to the embodiment shown in FIG. 29. In some embodiments, some conductive features 122 may extend on and electrically connect both a source/drain contact 110 and a gate electrode 94 (not shown in FIG. 39). In some embodiments, the conductive features 122 may have different widths, similar to the embodiment of FIG. 26. In some embodiments, a width of the conductive features 122 and/or a width of the gate contacts 124 may be in the range of about 7 nm to about 30 nm, though other widths are possible.

In some embodiments, an inter-metal dielectric (IMD) layer 132 may be formed over the second ILD 112, the conductive features 122, and the gate contacts 124. The IMD layer 132 may be formed using materials or techniques similar to those described for the first ILD 88 or the second ILD 112. In some embodiments, an etch stop layer 131 may be deposited before forming the IMD layer 132. The etch stop layer 131 may be formed using materials or techniques similar to those described previously for the CESL 87 or the etch stop layer 111. Metallization layers 134 may be formed in the IMD layer 132 to physically and electrically connect to the conductive features 122 and the gate contacts 124. For example, openings may be patterned in the IMD layer 132 and the etch stop layer 131, and then conductive material deposited in the openings to form the metallization layers 134. In some embodiments, the metallization layers 134 may be connected to the source/drain contacts 110 and the gate electrodes 94 by the conductive features 122 and the gate contacts 124, respectively. Omitting the conductive features 120 in this manner can reduce device manufacturing cost and overall device thickness.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

Embodiments of the present disclosure can achieve advantages. In some embodiments, a conductive feature such as a conductive contact or conductive line may be formed having smaller sizes or smaller separations without increasing the risk of electrical shorting. Techniques described herein allow for the formation of self-aligned source/drain contacts or gate contacts using a simpler process having a lower cost. In some embodiments, a planarization process is performed on the source/drain contacts and the gate stacks, which can allow for enlarged process windows, improved process flexibility, and smaller feature separation. In this manner, yield may be improved. Additionally, the techniques described herein can allow for reduced parasitic capacitance between contacts and/or conductive features, which can improve device performance and efficiency.

In an embodiment, a method includes forming a fin protruding from a substrate; forming a gate structure extending over the fin; forming a source/drain region in the fin adjacent the gate structure; forming a first isolation region over the source/drain region; forming a first mask layer over the gate structure; etching the first isolation region using the first mask layer as an etch mask to form a first recess; conformally depositing a second mask layer over the first mask layer and within the first recess; depositing a third mask layer over the second mask layer; etching the third mask layer, the second mask layer, and the first isolation region to form a second recess that exposes the source/drain region; and depositing a conductive material in the second recess. In an embodiment, the method includes performing a planarization process on the gate structure and the conductive material, wherein after performing the planarization process, top surfaces of the gate structure and the conductive material are level. In an embodiment, etching the first isolation region to form the first recess exposes a sidewall of the gate structure. In an embodiment, the method includes forming a second isolation region over the conductive material and the gate structure and forming a conductive feature that penetrates the second isolation region to physically and electrically contact the conductive material. In an embodiment, the conductive feature also physically and electrically contacts the gate structure. In an embodiment, the method includes forming a gate contact that penetrates the second isolation region to physically and electrically contact the gate structure, wherein top surfaces of the gate contact and the conductive feature are level. In an embodiment, the first recess has a depth in the range of 9 nm to 54 nm from a top surface of the first mask layer. In an embodiment, the first mask layer includes a metal oxide.

In an embodiment, a method includes forming gate stacks on a semiconductor fin; forming epitaxial source/drain regions in a semiconductor fin, wherein each epitaxial source/drain region is adjacent a respective gate stack; depositing a first dielectric layer over the epitaxial source/drain regions; forming capping layers on the gate stacks, wherein each capping layer is on a respective gate stack; recessing the first dielectric layer using a first etching process, wherein the first etching process exposes sidewalls of the gate stacks; depositing a conformal dielectric layer on the capping layers and on sidewalls of the gate stacks; recessing the conformal dielectric layer and the first dielectric layer to expose top surfaces of the epitaxial source/drain regions; forming source/drain contacts on the top surfaces of the epitaxial source/drain regions; and removing upper portions of the gate stacks and the source/drain contacts using a planarization process. In an embodiment, the first etching process selectively etches the first dielectric layer at a greater rate than the capping layers. In an embodiment, the conformal dielectric layer physically contacts a top surface of the first dielectric layer. In an embodiment, the method includes depositing a second dielectric layer on the conformal dielectric layer. In an embodiment, the second dielectric layer includes amorphous silicon. In an embodiment, the method includes implanting upper portions of the second dielectric layer with a dopant. In an embodiment, the first etching process forms a polymer over the plurality of capping layers. In an embodiment, the planarization process leaves top surfaces of the gate stacks level with top surfaces of the source/drain contacts.

In an embodiment, a device includes a semiconductor fin that includes a channel region between a first source/drain region and a second source/drain region; a gate stack over the channel region of the semiconductor fin; a first contact on the first source/drain region and a second contact on the second source/drain region, wherein top surfaces of the first contact, the second contact, and the gate stack are level; and a first interlayer dielectric (ILD) layer over the first contact, the second contact, and the gate stack. In an embodiment, the device includes a first conductive via in the first ILD layer that physically and electrically contacts the first contact and a second conductive via in the first ILD layer that physically and electrically contacts the second contact. In an embodiment, the first conductive via has a greater width than the second conductive via. In an embodiment, the second contact is a dummy contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin protruding from a substrate;
forming a gate structure extending over the fin;
forming a source/drain region in the fin adjacent the gate structure;
forming a first isolation region over the source/drain region;
forming a first mask layer over the gate structure;
etching the first isolation region using the first mask layer as an etch mask to form a first recess;
conformally depositing a second mask layer over the first mask layer and within the first recess;
depositing a third mask layer over the second mask layer;
etching the third mask layer, the second mask layer, and the first isolation region to form a second recess that exposes the source/drain region; and
depositing a conductive material in the second recess.

2. The method of claim 1 further comprising performing a planarization process on the gate structure and the conductive material, wherein after performing the planarization process, top surfaces of the gate structure and the conductive material are level.

3. The method of claim 1, wherein etching the first isolation region to form the first recess exposes a sidewall of the gate structure.

4. The method of claim 1 further comprising:
forming a second isolation region over the conductive material and the gate structure; and forming a conductive feature that penetrates the second isolation region to physically and electrically contact the conductive material.

5. The method of claim 4, wherein the conductive feature also physically and electrically contacts the gate structure.

6. The method of claim 4 further comprising forming a gate contact that penetrates the second isolation region to physically and electrically contact the gate structure, wherein top surfaces of the gate contact and the conductive feature are level.

7. The method of claim 1, wherein the first recess has a depth in the range of 9 nm to 54 nm from a top surface of the first mask layer.

8. The method of claim 1, wherein the first mask layer comprises a metal oxide.

9. A method comprising:
forming a plurality of gate stacks on a semiconductor fin;
forming a plurality of epitaxial source/drain regions in the semiconductor fin, wherein each epitaxial source/drain region is adjacent a respective gate stack;
depositing a first dielectric layer over the plurality of epitaxial source/drain regions;
forming a plurality of capping layers on the plurality of gate stacks, wherein each capping layer is on a respective gate stack;
recessing the first dielectric layer using a first etching process, wherein the first etching process exposes sidewalls of the plurality of gate stacks;
depositing a conformal dielectric layer on the plurality of capping layers and on sidewalls of the plurality of gate stacks;
recessing the conformal dielectric layer and the first dielectric layer to expose top surfaces of the plurality of epitaxial source/drain regions;
forming a plurality of source/drain contacts on the top surfaces of the plurality of epitaxial source/drain regions; and
removing upper portions of the plurality of gate stacks and the plurality of source/drain contacts using a planarization process.

10. The method of claim 9, wherein the first etching process selectively etches the first dielectric layer at a greater rate than the plurality of capping layers.

11. The method of claim 9, wherein the conformal dielectric layer physically contacts a top surface of the first dielectric layer.

12. The method of claim 9 further comprising depositing a second dielectric layer on the conformal dielectric layer.

13. The method of claim 12, wherein the second dielectric layer comprises amorphous silicon.

14. The method of claim 13 further comprising implanting upper portions of the second dielectric layer with a dopant.

15. The method of claim 9, wherein the first etching process forms a polymer over the plurality of capping layers.

16. The method of claim 9, wherein the planarization process leaves top surfaces of the plurality of gate stacks level with top surfaces of the plurality of source/drain contacts.

17. A device comprising:
a semiconductor fin comprising a channel region between a first source/drain region and a second source/drain region;
a gate stack over the channel region of the semiconductor fin;

a first contact on the first source/drain region and a second contact on the second source/drain region, wherein top surfaces of the first contact, the second contact, and the gate stack are level;

an etch stop layer over the first contact, the second contact, and the gate stack;

a first interlayer dielectric (ILD) layer over the etch stop layer; and a first conductive via extending through the first ILD layer and the etch stop layer to interface and electrically contact the first contact.

18. The device of claim 17 further comprising a second conductive via in the first ILD layer that physically and electrically contacts the gate stack, wherein the second conductive via is taller than the first conductive via.

19. The device of claim 17, wherein the first conductive via physically and electrically contacts the second contact, wherein a portion of the first conductive via is between a sidewall of the first source/drain region and a sidewall of the second source/drain region.

20. The device of claim 17, wherein the first conductive via also physically and electrically contacts the gate stack.

\* \* \* \* \*